(12) United States Patent
Du et al.

(10) Patent No.: US 12,308,734 B2
(45) Date of Patent: May 20, 2025

(54) POWER SUPPLY ENCLOSURE, POWER SUPPLY CONVERSION APPARATUS, AND ELECTRONIC DEVICE

(71) Applicant: Huawei Digital Power Technologies Co., Ltd., Shenzhen (CN)

(72) Inventors: Lin Du, Dongguan (CN); Guohua Fan, Dongguan (CN); Bo Zhang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 248 days.

(21) Appl. No.: 17/966,333

(22) Filed: Oct. 14, 2022

(65) Prior Publication Data
US 2023/0261565 A1    Aug. 17, 2023

(30) Foreign Application Priority Data

Oct. 15, 2021 (CN) .......................... 202111204608.2

(51) Int. Cl.
*H02M 1/32* (2007.01)
*H05K 7/20* (2006.01)

(52) U.S. Cl.
CPC ........ *H02M 1/327* (2021.05); *H05K 7/20263* (2013.01); *H05K 7/20436* (2013.01)

(58) Field of Classification Search
CPC ............. H05K 7/1427; H05K 7/20254; H05K 7/20263; H05K 7/20272; H05K 7/20436; H05K 7/20854; H05K 7/209; H05K 1/11; H05K 1/44; H05K 1/181; H05K 5/0047; B60R 16/03; B60L 53/22; H02M 1/00; H02M 1/327
See application file for complete search history.

(56) References Cited

U.S. PATENT DOCUMENTS

| | | | | |
|---|---|---|---|---|
| 5,841,634 | A | * 11/1998 | Visser | ................ H05K 7/20927 361/689 |
| 9,820,414 | B2 | * 11/2017 | You | ..................... H05K 7/20927 |
| 11,495,861 | B2 | 11/2022 | Wang et al. | |

(Continued)

FOREIGN PATENT DOCUMENTS

| | | |
|---|---|---|
| CN | 87208885 U | 7/1988 |
| CN | 207282668 U | 4/2018 |

(Continued)

OTHER PUBLICATIONS

DE-102018211128-B3 English Translation (Year: 2019).*
JP-2005198460-A English Translation (Year: 2005).*

*Primary Examiner* — Amir A Jalali
(74) *Attorney, Agent, or Firm* — Slater Matsil, LLP

(57) ABSTRACT

A power supply enclosure is disclosed in this application, the power supply enclosure includes a housing and a fixing plate. The housing has an accommodation cavity, and a first flow channel is disposed in the housing. The fixing plate is located in the accommodation cavity, at least a part of a surface of the fixing plate that faces the housing is fixedly connected to at least a part of an inner surface of the housing, and the fixing plate is configured to fix a power supply conversion functional assembly, so as to perform heat dissipation on a heat generating component in the power supply conversion functional assembly by using a cooling fluid in the first flow channel.

16 Claims, 16 Drawing Sheets

(56) References Cited

U.S. PATENT DOCUMENTS

| | | | | |
|---|---|---|---|---|
| 2014/0376184 A1* | 12/2014 | Gohara | ............. | H05K 7/20254 |
| | | | | 361/689 |
| 2015/0070845 A1* | 3/2015 | Hara | ..................... | H05K 7/209 |
| | | | | 361/699 |
| 2021/0176900 A1* | 6/2021 | Zhu | ................... | H05K 7/20272 |
| 2021/0298208 A1 | 9/2021 | Simonazzi | | |

FOREIGN PATENT DOCUMENTS

| | | | | |
|---|---|---|---|---|
| CN | 111192985 A | 5/2020 | | |
| CN | 210641246 U | 5/2020 | | |
| CN | 211457827 U | 9/2020 | | |
| DE | 102018211128 B3 * | 11/2019 | ......... | F04D 29/5813 |
| JP | 2005198460 A * | 7/2005 | | |

* cited by examiner

POWER SUPPLY ENCLOSURE, POWER SUPPLY CONVERSION APPARATUS, AND ELECTRONIC DEVICE

CROSS-REFERENCE TO RELATED APPLICATION

This application claims priority to Chinese Patent Application No. 202111204608.2, filed on Oct. 15, 2021, which is hereby incorporated by reference in its entirety.

TECHNICAL FIELD

This application relates to the field of power supply technologies, and in particular, to a power supply enclosure, a power supply conversion apparatus, and an electronic device.

BACKGROUND

A switch mode power supply, also referred to as a switching-mode power supply or a switching convener, is a high-frequency electric energy conversion apparatus, and is one type of power supply. The switching power supply is configured to convert, by using different forms of architectures, a voltage into a voltage or a current required by a client. As a power module density of the switch mode power supply becomes higher, conventional air cooling and natural heat dissipation cannot meet a heat dissipation requirement. Liquid cooling heat dissipation is used for more and more high-power modules. For example, when a power module is a vehicle-mounted charger, a MOS transistor and a magnetic component of the vehicle-mounted charger are major heat generating components. To quickly dissipate heat for the heat generating components, there are a plurality of solutions for heat dissipation of the vehicle-mounted charger. Usually, a water channel is disposed in a power supply enclosure, and the MOS transistor is attached to a wall of the water channel for heat dissipation. In this way, the heat is directly carried away by cooling water in the water channel. The power supply enclosure may be formed by using a deep drawing process or a die casting process, and a flow channel is formed. However, when the deep drawing process is used to form the enclosure, a fixing post cannot be integrally formed by deep drawing. Each fixing post needs to be separately fixed in the enclosure, and then a component is fixed by using the fixing post. This causes a long process time, and also causes poor stability of connection between the fixing post and the deep-drawn enclosure. When the enclosure is formed by using the die casting process, although a fixing post may be formed during die casting, die costs and process complexity of die casting increase.

SUMMARY

This application provides a power supply enclosure that can stably fix a component.

According to a first aspect, this application provides a power supply enclosure, including a housing and a fixing plate. The housing has an accommodation cavity, and a first flow channel is disposed in the housing. The fixing plate is located in the accommodation cavity, at least a part of a surface of the fixing plate that faces the housing is fixedly connected to at least a part of an inner surface of the housing, and the fixing plate is configured to fix a power supply conversion functional assembly, so as to perform heat dissipation on a heat generating component in the power supply conversion functional assembly by using a cooling fluid in the first flow channel.

In an implementation, the housing is formed by using a deep drawing process, and a material of the housing is aluminum. An aluminum plate is subjected to the deep drawing process to form the housing with the accommodation cavity. The first flow channel in the housing is configured to cool the heat generating component in the power supply conversion functional assembly. The cooling fluid in the first flow channel may be water, a cooling medium, or a phase change medium.

In some implementations, the housing is formed by using a die casting process, and the first flow channel is formed.

In this application, the power supply enclosure is applied to a power supply conversion apparatus, and the power supply conversion apparatus includes the power supply enclosure and the power supply conversion functional assembly located in the power supply enclosure. The power supply enclosure further includes a cover plate, one side of the housing has an opening, and the cover plate covers the opening of the housing.

The power supply conversion functional assembly includes a circuit board, a magnetic component, and the like. Heat generating components of the power supply conversion functional assembly include an insulated gate bipolar transistor, a triode, a MOS transistor, and the like located on the circuit board. The heat generating components further include an inductor component, a transformer, or the like in the magnetic component. One function of the circuit board is to connect the insulated gate bipolar transistor, the triode, the MOS transistor, the magnetic component, and the like. Because the power supply conversion functional assembly has a plurality of components, these components need to be fixed in the accommodation cavity of the housing. For the housing formed by using the die casting process, a fixing post may be directly formed on an inner wall of the housing by die casting. The fixing post is configured to fix a component. However, there is usually a large quantity of fixing posts, which increase die costs and process complexity of die casting. When the housing is formed by using the deep drawing process, a fixing post configured to fix a component cannot be integrally formed on an inner surface of the housing, but needs to be welded on the inner surface of the housing. Usually, the fixing post is first welded or fixed by using adhesive to the inner surface of the housing, and then the power supply conversion functional assembly is fixed by using the fixing post, to fix the power supply conversion functional assembly to the housing. In this manner, the fixing posts need to be fixed one by one on the inner surface of the housing. In one aspect, an end face size of the fixing post is usually small, and fixing to the inner surface of the housing is unstable. In another aspect, if the fixing posts are welded one by one to the housing or are bonded one by one to the housing by using adhesive, a welding process is time-consuming and complex. In still another aspect, when a material of the housing formed by using the deep drawing process or the die casting process is aluminum, stability of direct welding on the aluminum housing is poor, a welding yield is low, and stability of direct bonding on the aluminum housing by using adhesive is also poor.

In this application, at least a part of a surface of the fixing plate that faces the housing is fixedly connected to at least a part of an inner surface of the housing. A manner of the fixed connection includes welding or adhesive bonding. The fixed connection between the surface of the fixing plate and the surface of the housing can improve connection stability. Compared with a manner of connection between a small-size end face of a stud and an inner surface of the housing, the manner of face-to-face connection between the surface of the fixing plate and the surface of the housing has a large connection area, and higher connection stability. Then, the fixing plate and the power supply conversion functional assembly are fixedly connected to each other, to fix the power supply conversion functional assembly in the accommodation cavity inside the housing. Compared with the manner of forming the fixing post by using the die casting process, a process of using the fixing plate is simpler, and process costs are low.

In an implementation, the entire surface of the fixing plate that faces the housing is fixedly connected to the inner surface of the housing, to improve stability of the connection between the fixing plate and the housing. In an implementation, a part of the surface of the fixing plate that faces the housing is fixedly connected to the inner surface of the housing.

In a possible implementation, the fixing plate is provided with a fixing hole running through two opposite surfaces of the fixing plate. The fixing hole is internally provided with a fixing sub-member. The fixing hole cooperates with the fixing sub-member to fix the power supply conversion functional assembly.

In an implementation, an area of the surface of the fixing plate that faces the housing is greater than ¼ of an area of the inner surface of the housing, so that the fixing plate has an enough area to mount an abundant quantity of fixing sub-members.

In a possible implementation, the housing includes a bottom plate and a peripheral side plate that is located on one side of the bottom plate and that surrounds the bottom plate, the bottom plate and the peripheral side plate form the accommodation cavity through enclosure, the fixing plate includes a first fixing sub-plate stacked with the bottom plate, at least a part of a surface of the first fixing sub-plate that faces the bottom plate is fixedly connected to at least a part of an inner surface of the bottom plate, and an area of the surface of the first fixing sub-plate that faces the bottom plate is greater than or equal to 0.5 times an area of the surface of the bottom plate that faces the first fixing sub-plate, and is less than or equal to the area of the surface of the bottom plate that faces the first fixing sub-plate.

In an implementation, the peripheral side plate is perpendicular to the bottom plate. When the housing is formed by using the deep drawing process, the peripheral side plate can be disposed perpendicular to the bottom plate. In this implementation, when the housing is formed by using the deep drawing process, a junction between the peripheral side plate and the bottom plate is a fillet. In an implementation, the peripheral side plate deviates from a direction perpendicular to the bottom plate by an angle. When the housing is formed by using the die casting process, the peripheral side plate has a pattern draft, so that the peripheral side plate deviates from the direction perpendicular to the bottom plate by an angle.

The area of the first fixing sub-plate is set to be greater than half the area of the bottom plate, and this helps fix the power supply conversion functional assembly. Because the power supply conversion functional assembly has many scattered functional components, including but not limited to a circuit board, an inductor component, a transformer, and the like, when these functional components are distributed in the left, right, front, rear, or middle of the accommodation cavity, the area of the first fixing sub-plate cannot be too small. The area of the surface of the first fixing sub-plate that faces the bottom plate is greater than or equal to 0.5 times the area of the surface of the bottom plate that faces the first fixing sub-plate. In this way, the first fixing sub-plate has enough area to mount an abundant quantity of fixing sub-members, to fix each functional component in the power supply conversion functional assembly.

In some implementations, when the area of the first fixing sub-plate is small, the first fixing sub-plate may be patterned, so that the first fixing sub-plate can fix a functional component that is in the power supply conversion functional assembly and that faces the bottom plate. A specific pattern may be designed based on arrangement locations and a quantity of components in the power supply conversion functional assembly.

In a possible implementation, the fixing plate further includes a second fixing sub-plate, the second fixing sub-plate is located on an inner side of the peripheral side plate, and intersects the first fixing sub-plate, and at least a part of a surface of the second fixing sub-plate that faces the peripheral side plate is fixedly connected to at least a part of an inner surface of the peripheral side plate. The second fixing sub-plate can fix the power supply conversion functional assembly from a side, for example, can fix a surface of a magnetic component that faces the peripheral side plate, thereby improving stability of a fixed connection. The second fixing sub-plate intersects the first fixing sub-plate, and this includes that the second fixing sub-plate intersects the first fixing sub-plate perpendicularly, or the second fixing sub-plate deviates from a direction perpendicular to the first fixing sub-plate by an angle. For example, in an implementation, a value of an included angle between the second fixing sub-plate and the first fixing sub-plate is greater than or equal to 80° and less than 90°. The second fixing sub-plate may be configured to fix a part that is of the power supply conversion functional assembly and that has a distance from the peripheral side plate.

In an implementation, the second fixing sub-plate and the first fixing sub-plate are an integrated structure. In other words, the fixing plate is an integrated structure. A material of the fixing plate is aluminum. In an implementation, a shape of the fixing plate matches the housing, and the fixing plate is attached to the inner wall of the housing. The fixing plate may be formed by using the deep drawing process, or the fixing plate may be formed by a bending process.

In an implementation, the second fixing sub-plate includes a first part and a second part that are disposed opposite to each other in a first direction. The peripheral side plate includes a first side plate and a second side plate that are disposed opposite to each other in the first direction. The first part is located on a surface of the first side plate that faces the accommodation cavity, and the second part is located on a surface of the second side plate that faces the accommodation cavity. The first part, the first fixing sub-plate, and the second part are an integrated structure. The first part and the second part are respectively fixedly connected to the first side plate and the second side plate to fix the second fixing sub-plate to the peripheral side plate. The second fixing sub-plate includes only the first part and the second part, and therefore costs can be reduced while connection reliability is ensured.

In some implementations, the second fixing sub-plate further includes a third part disposed on a side that is of the first fixing sub-plate and that is in a second direction. The third part, is configured to fix a surface that is on a side of the power supply conversion functional assembly and that is in the second direction. The second direction intersects the first direction. In a specific implementation, the first direction is a width direction of the power supply enclosure, the second direction is a length direction of the power supply enclosure, and the second direction intersects the first direction perpendicularly. In some implementations, the first direction is a length direction of the power supply enclosure, and the second direction is a width direction of the power supply enclosure.

In an implementation, the fixing plate is fixedly connected to both the bottom plate and the peripheral side plate of the housing. In this way, an area of the fixed connection is increased, and stability of the fixed connection is improved.

In an implementation, one end of the second fixing sub-plate that is away from the first fixing sub-plate is provided with a fixing piece, and the fixing piece extends from the second fixing sub-plate to the middle of the accommodation cavity. The fixing piece is configured to fix a functional component that is in the power supply conversion functional assembly and that is disposed away from the bottom plate.

In an implementation, the power supply conversion functional assembly includes two circuit boards that are disposed opposite to each other in a third direction. The third direction intersects the first direction and the second direction perpendicularly. The third direction is a height direction of the power supply enclosure. One circuit board is fixedly connected to the first fixing sub-plate, and the other circuit board is located on one side of the fixing piece that is away from the bottom plate, and is fixedly connected to the fixing piece. Specifically, a hole may be opened on the fixing piece, and the circuit board is fixed to the fixing piece by using a stud or a riveting member.

In a possible implementation, parts of the housing except the first flow channel are an integrated structure. In the housing of the integrated structure, the bottom plate and the peripheral side plate are continuous, and no welding member or fixing member is required. In this way, costs can be reduced, and air-tightness of the first flow channel is good. In some implementations, a groove channel is formed by using the die casting process, and then the flow channel is formed by covering the groove channel with a sealing plate. A sealing location between the sealing plate and the groove channel needs to be welded by friction stir welding or bonded by using adhesive. Consequently, air-tightness of the flow channel is poor, and stability of welding or adhesive bonding is poor after long-term use. In addition, cooling water is more sensitive to defects such as an air hole, shrinkage porosity, and a crack in the groove channel formed by die casting, and a risk of water leakage is high. The parts of housing except those forming the first flow channel are an integrated structure, in other words, an edge of the first flow channel is integrated. Therefore, air-tightness is good, and the risk of water leakage can be avoided.

In a possible implementation, the housing includes a first sub-housing and a second sub-housing, the first sub-housing is nested in the second sub-housing, a cavity of the first sub-housing is the accommodation cavity, the first sub-housing is fixedly connected to the fixing plate, the first flow channel is located between the first sub-housing and the second sub-housing, and parts of the first sub-housing and the second sub-housing except those forming the first flow channel are hot-rolled and fused into an integrated structure.

In an implementation, the first sub-housing includes a first bottom wall and a first side wall that is located on one side of the first bottom wall and that is disposed around the first bottom wall. The second sub-housing includes a second bottom wall and a second side wall that is located on one side of the second bottom wall and that is disposed around the second bottom wall. The first bottom wall and the second bottom wall are stacked to jointly form the bottom plate. The first side wall and the second side wall are stacked to jointly form the peripheral side plate. A part of the first flow channel is located between the first bottom wall and the second bottom wall, and a part of the first flow channel is located between the first side wall and the second side wall. In some implementations, the first flow channel may be located only between the first side wall and the second side wall, and is disposed around the entire first side wall. In some implementations, the first flow channel may be located only between the first bottom wall and the second bottom wall, and a pattern of the first flow channel may be set based on an actual requirement.

Materials of the first sub-housing and the second sub-housing are aluminum. Aluminum is inexpensive, and has a large coefficient of thermal conductivity. Copper is expensive, and a coefficient of thermal conductivity of stainless steel is small.

In a possible implementation, the first sub-housing includes a first protrusion part protruding in a direction away from the second sub-housing, and the second sub-housing and the first protrusion part form the first flow channel. In an implementation, a thickness of the first protrusion part is less than a thickness of another part of the second sub-housing. The thickness is a size in a direction perpendicular to the first protrusion part or the second sub-housing. In an implementation, a thickness of the second sub-housing is 1.5 mm, and the thickness of the first protrusion part is 1 mm. In an implementation, when the first protrusion part is formed by using the deep drawing process, a junction between the first protrusion part and a part of the first sub-housing except the first protrusion part is a fillet.

In a possible implementation, the second sub-housing includes a second protrusion part protruding in a direction away from the first sub-housing, and the first sub-housing and the second protrusion part form the first flow channel. In an implementation, when the second protrusion part is formed by using the deep drawing process, a junction between the second protrusion part and a part of the second sub-housing except the second protrusion part, is a fillet.

In a possible implementation, the first sub-housing includes a first protrusion part protruding in a direction away from the second sub-housing. The second sub-housing includes a second protrusion part protruding in a direction away from the first sub-housing. The first protrusion part and the second protrusion part are disposed oppositely and connected to each other to jointly form the first flow channel.

In a possible implementation, the housing includes a first sub-housing and a second sub-housing, the first sub-housing is nested in the second sub-housing, a cavity of the first sub-housing is the accommodation cavity, the first sub-housing is fixedly connected to the fixing plate, the first flow channel is located between the first sub-housing and the second sub-housing, and an edge of an opening of the first sub-housing is sealed with an edge of an opening of the second sub-housing. The first sub-housing is a groove structure formed by a first bottom wall and a first side wall, and an opening of the groove structure is the opening of the first sub-housing. The second sub-housing is a groove structure formed by a second bottom wall and a second side wall, and an opening of the groove structure is the opening of the second sub-housing.

In a possible implementation, the fixing plate is provided with an avoidance hole running through two opposite surfaces of the fixing plate, a projection of the avoidance hole on the first sub-housing in a thickness direction of the first sub-housing at least partially overlaps a projection of the first flow channel on the first sub-housing in the thickness direction of the first sub-housing, and the avoidance hole is configured to accommodate at least one of the heat generating components. The thickness direction of the first sub-housing is a direction perpendicular to a part that is of the first sub-housing and in which the first flow channel is located. When the avoidance hole is located on the first fixing sub-plate, the thickness direction of the first sub-housing is a direction perpendicular to the first bottom wall. When the avoidance hole is located on the second fixing sub-plate, the thickness direction of the first sub-housing is a direction perpendicular to the first side wall.

In a possible implementation, the first flow channel includes a first sub-channel located inside the bottom plate. The fixing plate includes a first fixing sub-plate disposed opposite to the bottom plate in a third direction. At least one avoidance hole is located in the first fixing sub-plate. At least a part of the first sub-channel is disposed opposite to the avoidance hole located in the first fixing sub-plate in the third direction. In an implementation, the third direction is a height direction of the power supply enclosure, and the first sub-channel is configured to cool a heat generating component above the bottom plate. In the power supply conversion apparatus, the circuit board is usually disposed above the bottom plate of the housing. The circuit board and the fixing plate are fixed by attaching to each other face to face. The first sub-channel cools the heat generating components such as the insulated gate bipolar transistor, the triode, and the MOS transistor on the circuit board through the avoidance hole.

In a possible implementation, the first flow channel further includes a second sub-channel located inside the peripheral side plate. The first sub-channel and the second sub-channel are connected to each other. The fixing plate includes a second fixing sub-plate. The second fixing sub-plate is fixedly connected to a surface of the peripheral side plate, and is connected to the first fixing sub-plate. At least one avoidance hole is located in the second fixing sub-plate. At least a part of the second sub-channel is disposed opposite to the avoidance hole located in the second fixing sub-plate in the third direction. The second sub-channel is configured to cool the heat generating components on a side of the peripheral side plate, such as an inductor and a capacitor in magnetic components. The magnetic components may be disposed adjacent to the peripheral side plate, so that the second sub-channel in the peripheral side plate can cool the magnetic components for heat dissipation.

The fixing plate may be provided with a plurality of avoidance holes, at least one of the plurality of avoidance holes is located in the first fixing sub-plate, and the remaining avoidance hole is located in the second fixing sub-plate.

In a possible implementation, the first sub-housing includes a first protrusion part protruding in a direction away from the second sub-housing. The second sub-housing and the first protrusion part from the first flow channel. The first protrusion part is located in an avoidance hole. The first protrusion part, abuts against at least a part of an inner surface that is of the power supply conversion functional assembly and that faces the first sub-housing. The first protrusion part is disposed in the avoidance hole to till the avoidance hole, so that the power supply conversion functional assembly is placed flat on the fixing plate. In this way, flatness is improved, and a part of the circuit board located at the avoidance hole is prevented from being crushed when being impacted.

In a possible implementation, the power supply enclosure further includes a liquid inlet nozzle and a liquid outlet nozzle. The liquid inlet nozzle and the liquid outlet nozzle are located on two sides of the housing, and are connected to the first flow channel. Holes may be opened on an outer wall of the housing, and the holes are brazed with the liquid inlet nozzle and the liquid outlet nozzle by using a brazing process, to connect to the first flow channel. In an implementation, a part of the first flow channel is located in the bottom plate, and a part of the first flow channel is located in the peripheral side plate. The liquid inlet nozzle and the liquid outlet nozzle are located on an outer side of the peripheral side plate, and are connected to the first flow channel in the peripheral side plate. In some implementations, the liquid inlet nozzle and the liquid outlet nozzle are located on a same side of the peripheral side plate.

In a possible implementation, the power supply enclosure further includes a third sub-housing, the first sub-housing and the second sub-housing are nested in the third sub-housing, and a second flow channel is disposed between the third sub-housing and the second sub-housing. The first sub-housing is nested in the second sub-housing, and the second sub-housing is nested in the third sub-housing. The first flow channel and the second flow channel are disposed, so that a heat dissipation effect is better. The first flow channel is disposed closer to the heat generating components in the power supply conversion functional assembly than the second flow channel. The first flow channel cools the heat generating components by heat absorption, and heat from the first flow channel after heat absorption is absorbed by the second flow channel, to transfer the heat out. In some implementations, a cooling liquid in the first flow channel and that in the second flow channel may beset to have different temperatures. The cooling liquid with a temperature difference can improve heat exchange efficiency between the first flow channel and the second flow channel, to further improve heat dissipation efficiency of the heat generating components.

In a possible implementation, the second sub-housing includes a third protrusion part protruding in a direction away from the third sub-housing, and the third sub-housing and the third protrusion part form the second flow channel. In an implementation, a thickness of the third protrusion part is less than a thickness of the third sub-housing. The thickness is a size in a direction perpendicular to the third protrusion part or the third sub-housing. In an implementation, the thickness of the third sub-housing is 1.5 mm, and the thickness of the third protrusion part is 1 mm.

In a possible implementation, the third sub-housing includes a fourth protrusion part protruding in a direction away from the second sub-housing, and the second sub-housing and the fourth protrusion part form the second flow channel.

In a possible implementation, the second sub-housing includes a third protrusion part protruding in a direction away from the third sub-housing. The third sub-housing includes a fourth protrusion part protruding in a direction away from the second sub-housing. The third protrusion part and the fourth protrusion part are disposed oppositely and connected to each other to jointly form the second flow channel.

In an implementation, an area size of an inner surface of the third sub-housing is equal to an area size of an outer surface of the second sub-housing. The third sub-housing forms an integrated structure by using the deep drawing process. The third sub-housing includes a third bottom wall and a third side wall. The third bottom wall is located on one side of the second bottom wall that is away from the first bottom wall. The third side wall is located on one side of the second side wall that is away from the first side wall. The second flow channel is located between the third bottom wall and the second bottom wall. The third bottom wall, the second bottom wall, and the first bottom wall are stacked in the third direction to jointly form the bottom plate, and the second flow channel is located in the bottom plate.

In an implementation, the second flow channel is located between the third side wall and the second side wall. The third side wall, the second side wall, and the first side wall jointly form the peripheral side plate, and the second flow channel is located in the peripheral side plate.

In an implementation, a part of the second flow channel is located between the third bottom wall and the second bottom wall, and a part of the second flow channel may be located between the third side wall and the second side wall. The second flow channel is distributed in the bottom plate and the peripheral side plate.

In a possible implementation, a projection of the second flow channel on the second sub-housing in a thickness direction of the second sub-housing at least partially overlaps a projection of the first flow channel on the second sub-housing in the thickness direction of the second sub-housing. The thickness direction of the second sub-housing is a direction perpendicular to a part that is of the second sub-housing and in which the second flow channel or the first flow channel is located. For example, when the second flow channel and the first flow channel are located in the bottom plate of the housing, the thickness direction is a direction perpendicular to the bottom plate. When the second flow channel and the first flow channel are located in the second side plate of the peripheral side plate, the thickness direction is a direction perpendicular to the second side plate.

According to the foregoing design, heat transfer between the second flow channel and the first flow channel is continuous. The first flow channel may extend to a location of a heat generating component that needs heat dissipation, so that the second flow channel and the first flow channel are more flexibly designed, to adapt to a plurality of types of power supply conversion functional assemblies disposed in different structures.

In a possible implementation, the second flow channel is not connected to the first flow channel, a first medium is provided in the first flow channel, a second medium is provided in the second flow channel, and a thermal conductivity of the second medium is greater than a thermal conductivity of the first medium. That a thermal conductivity of the second medium is greater than a thermal conductivity of the first medium indicates that the second medium has better heat dissipation efficiency, and can rapidly absorb heat of the heat generating components. In an implementation, the second medium is a phase change material, and the first medium is water.

In some implementations, the second flow channel is connected to the first flow channel, and the two layers of flow channels can increase a flow path of a coolant in the housing, thereby improving a heat dissipation effect.

In some implementations, the housing may further include more stacked sub-housings to form a plurality of flow channels, which may be specifically disposed based on a requirement, to improve a heat dissipation effect.

According to a second aspect, this application further provides a power supply conversion apparatus. The power supply conversion apparatus includes a power supply conversion functional assembly and the power supply enclosure according to any one of the foregoing implementations. The power supply conversion functional assembly is located in an accommodation cavity in a housing, and is fixedly connected to a fixing plate. The power supply conversion apparatus implements a power supply conversion function by using the power supply conversion functional assembly. Power supply conversion includes converting an alternating current into a high-voltage direct current, for example, converting a 220 V household alternating current or a 380 V commercial alternating current into a high-voltage direct current for charging a target device. When the target device is a vehicle, the high-voltage direct current may be 450 V. Alternatively, the target device may be another device that needs to be powered. The power supply conversion further includes converting a high-voltage direct current into a low-voltage direct current, for example, converting a high-voltage direct current in a vehicle into a low-voltage direct current that supplies power to low-voltage components such as a vehicle lamp, a stereo, and a radio.

The power supply conversion functional assembly includes a circuit board, a magnetic component, and the like. Heat generating components of the power supply conversion functional assembly include an insulated gate bipolar transistor, a triode, a MOS transistor, and the like located on the circuit board. The heat generating components further include an inductor component, a transformer, or the like in the magnetic component. One function of the circuit board is to connect the insulated gate bipolar transistor, the triode, the MOS transistor, the magnetic component, and the like.

In a possible implementation, the power supply enclosure further includes a cover plate, one side of the housing has an opening, and the cover plate covers the opening of the housing.

According to a third aspect, this application further provides an electronic device. The electronic device includes a load and the foregoing power supply conversion apparatus. The power supply conversion apparatus is electrically connected to the load and configured to supply power to the load. The power supply conversion apparatus provides converted power to the load, to supply power to the load.

In a possible implementation, the electronic device is a vehicle, a charging pile, a charging power station, a communication device, or a data center. The data center includes a cabinet or a data equipment room. Alternatively, the electronic device may be another device that requires power supply conversion.

In some implementations, when the electronic device is a data center, the load is a server in the data center. The power supply conversion apparatus converts 380 V commercial power into a direct current that supplies power to the server. A voltage obtained after conversion by the power supply conversion apparatus may be set based on the load.

DESCRIPTION OF DRAWINGS

To describe technical solutions in embodiments of this application more clearly, the following describes accompanying drawings required for describing the embodiments of this application.

DESCRIPTION OF EMBODIMENTS

The following describes technical solutions in embodiments of this application with reference to the accompanying drawings in embodiments of this application. It is clear that the described embodiments are merely a part rather than all of embodiments of this application.

The terms "first" and "second" in this specification are merely intended for a purpose of description, and shall not be understood as an indication or implication of relative importance or implicit indication of a quantity of indicated technical features. Therefore, a feature limited by "first" or "second" may explicitly indicate or implicitly include one or more such features. In the descriptions of this application, unless otherwise stated, "a plurality of" means two or more than two.

In addition, in this specification, orientation terms such as "top" and "bottom" are defined relative to orientations of schematically disposed structures in the accompanying drawings. It should be understood that these directional terms are relative concepts and are used for relative description and clarification, and may vary accordingly with changes in the orientations of the structures.

For ease of understanding, the following first explains and describes English short names and related technical terms in the embodiments of this application.

Deep drawing process: also referred to as a drawing process, a stretching process, a calendering process, or the like, is a mechanical processing process in which a mold is used to stamp a plate blank in a specific shape obtained after blanking into various open hollow parts or to reduce a diameter of an open hollow blank to increase a height. The deep drawing process can be used to manufacture thin-walled components in cylindrical, stepped, conical, spherical, box-shaped, and other irregular shapes.

MOS transistor: a short name of MOSFET, Metal-Oxide-Semiconductor Field-Effect Transistor.

Die casting: a precision casting method in which molten metal is forced into a metal mold with a complex shape by using a high pressure. Die casting is characterized by applying a high pressure to molten metal by using an inner cavity of a mold. The mold is usually fabricated by using alloy with higher strength.

Pattern draft: also referred to as draw taper. It is an inclination designed on both sides of an impression to facilitate mold stripping.

Welding flange: a part that connects pipes and is connected to pipe ends.

Friction stir welding: refers to locally melting a to-be-welded material by using heat generated by friction between a high-speed rotating weldment and a workpiece. When the weldment moves forward along a welding interface, the plasticized material flows from the front to the rear of the weldment under a rotational friction force of the weldment, and a dense solid weld is formed under extrusion of the weldment.

Figure 1:
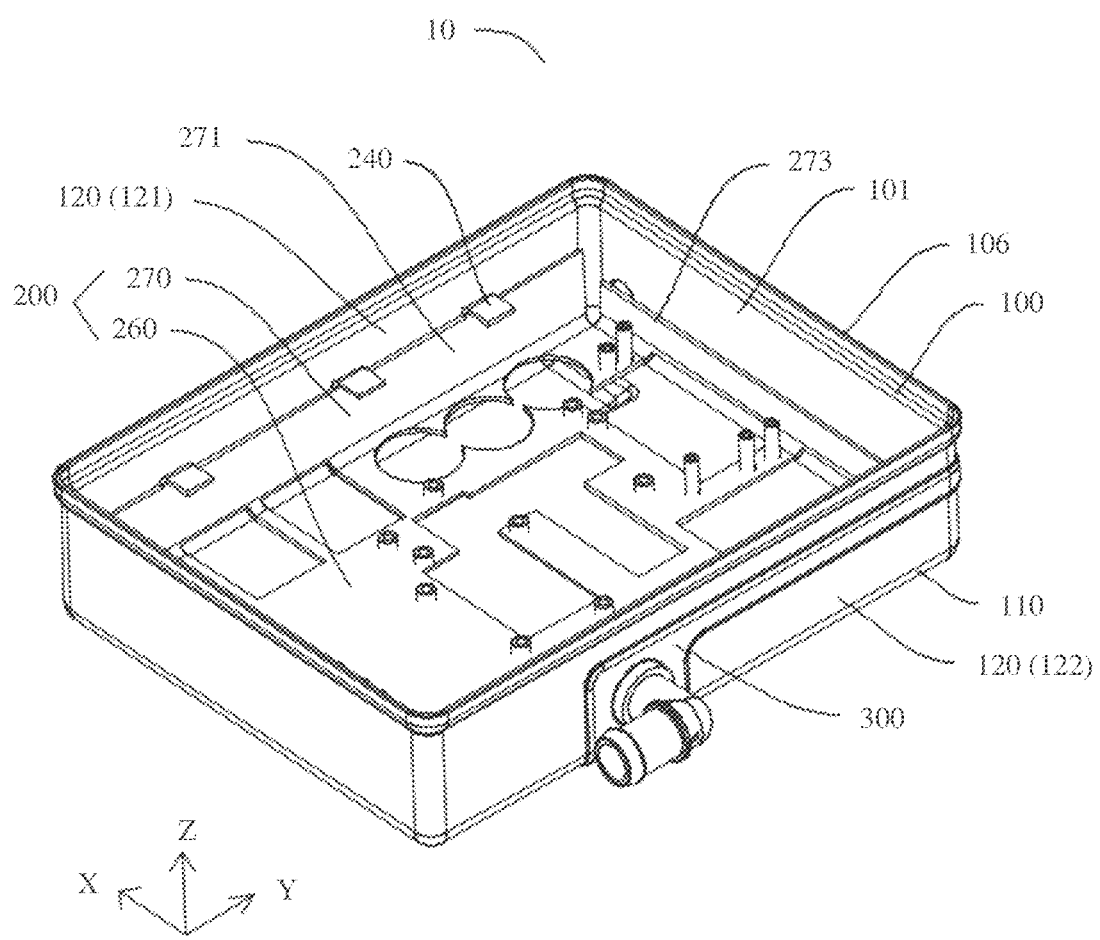
FIG. 1 is a schematic diagram of a three-dimensional structure of a power supply enclosure according to an implementation of this application.
Figure 2A:
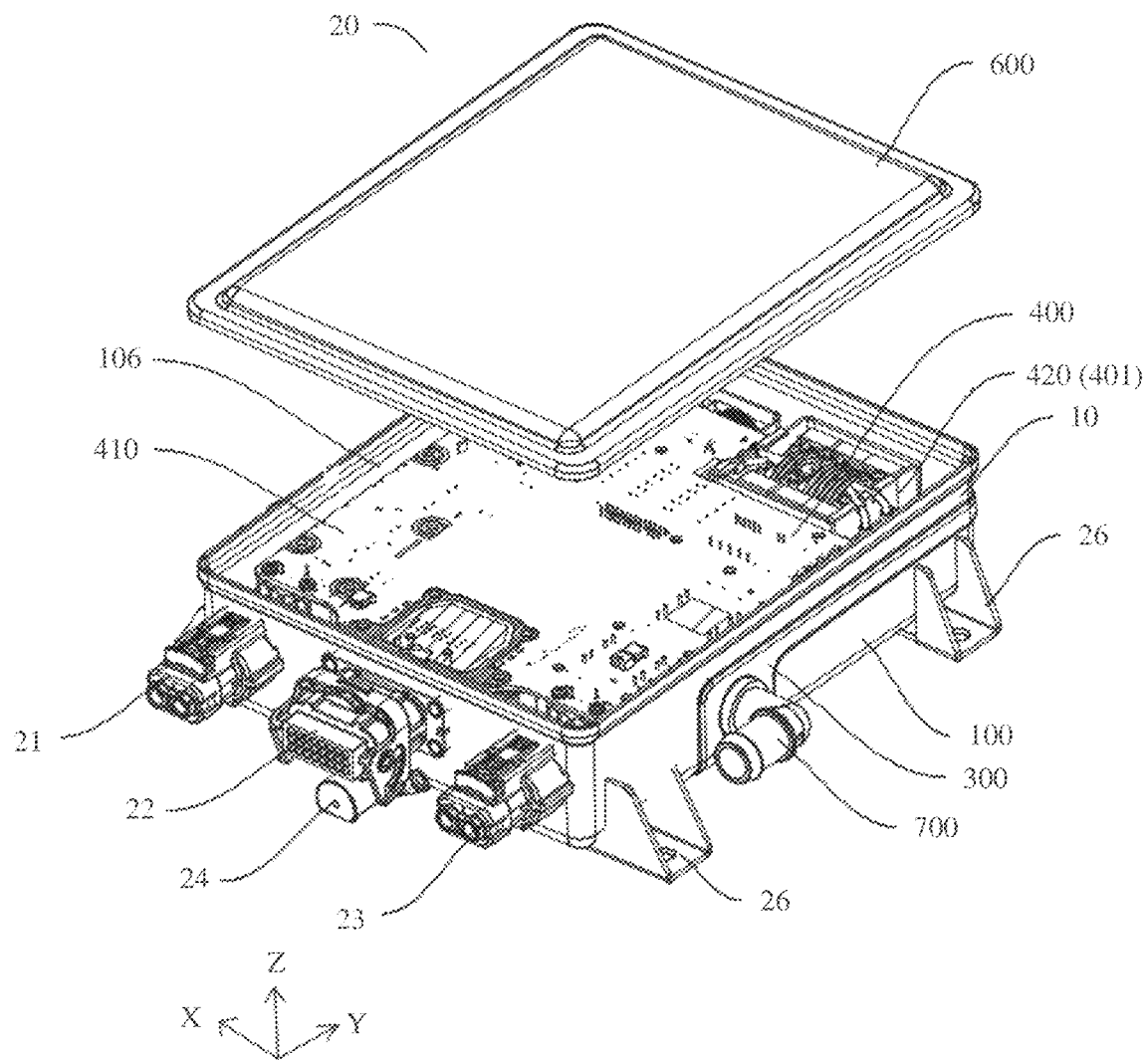
FIG. 2a is a schematic diagram of a three-dimensional structure of a power supply conversion apparatus according to an implementation of this application.

Referring to FIG. 1, an implementation of this application provides a power supply enclosure 10, including a housing 100 and a fixing plate 200. The housing 100 has an accommodation cavity 101, and a first flow channel 300 is disposed in the housing 100. The fixing plate 200 is located in the accommodation cavity 101. At least a part of a surface of the fixing plate 200 that faces the housing 100 is fixedly connected to at least a part, of an inner surface of the housing 100. The fixing plate 200 is configured to fix a power supply conversion functional assembly 400 (as shown in FIG. 2a). Heat dissipation is performed on a heat generating component 401 in the power supply conversion functional assembly 400 by using a cooling fluid in the first flow channel 300.

The housing 100 is formed by using a deep drawing process, and a material of the housing 100 is aluminum. An aluminum plate is subjected to the deep drawing process to form the housing 100 with the accommodation cavity 101. The first flow channel 300 in the housing 100 is configured to cool the heat generating component 401 in the power supply conversion functional assembly 400. The cooling fluid in the first flow channel 300 may be water, a cooling medium, or a phase change medium. In some implementations, the housing 100 is formed by using a die casting process, and the first flow channel 300 is formed.

Figure 3:
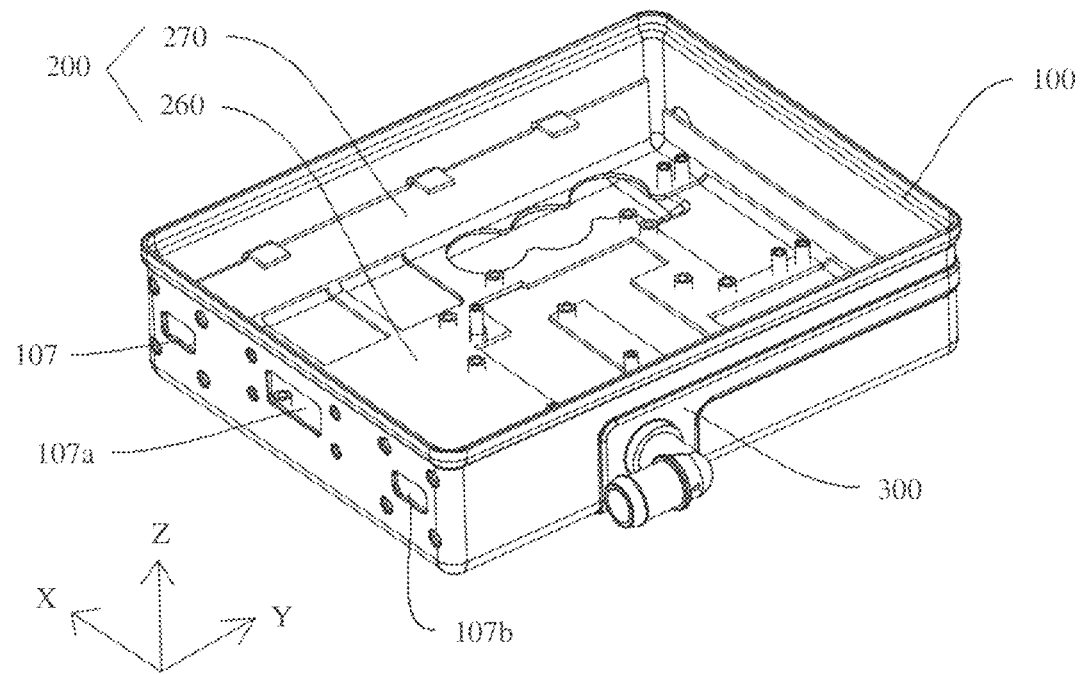
FIG. 3 is a schematic diagram of a three-dimensional structure of a power supply enclosure according to an implementation of this application.

In this application, the power supply enclosure 10 is applied to a power supply conversion apparatus 20 (as shown in FIG. 2a). The power supply conversion apparatus 20 includes the power supply enclosure 10 and the power supply conversion functional assembly 400 located in the power supply enclosure 10. The power supply enclosure 10 further includes a cover plate 600. One side of the housing 100 has an opening 106, and the cover plate 600 covers the opening 106 of the housing 100. The power supply conversion functional assembly 400 is a combination of components configured to implement a power supply conversion function. Power supply conversion includes converting an alternating current into a high-voltage direct current, for example, converting a 220 V household alternating current or a 380 V commercial alternating current into a high-voltage direct current for charging a target device. When the target device is a vehicle, the high-voltage direct current may be 450 V. Alternatively, the target device may be another device that needs to be powered. The power supply conversion further includes converting a high-voltage direct current into a low-voltage direct current, for example, converting a high-voltage direct current in a vehicle into a low-voltage direct current that supplies power to low-voltage components such as a vehicle lamp, a stereo, and a radio. A connection hole 107 may be disposed in the housing 100 (as shown in FIG. 3). The power supply conversion apparatus 20 further includes a connection part 21 (as shown in FIG. 2a). The connection part 21 is connected to the power supply conversion functional assembly 400 and an external load or an external power supply through the connection hole 107.

Figure 2B:
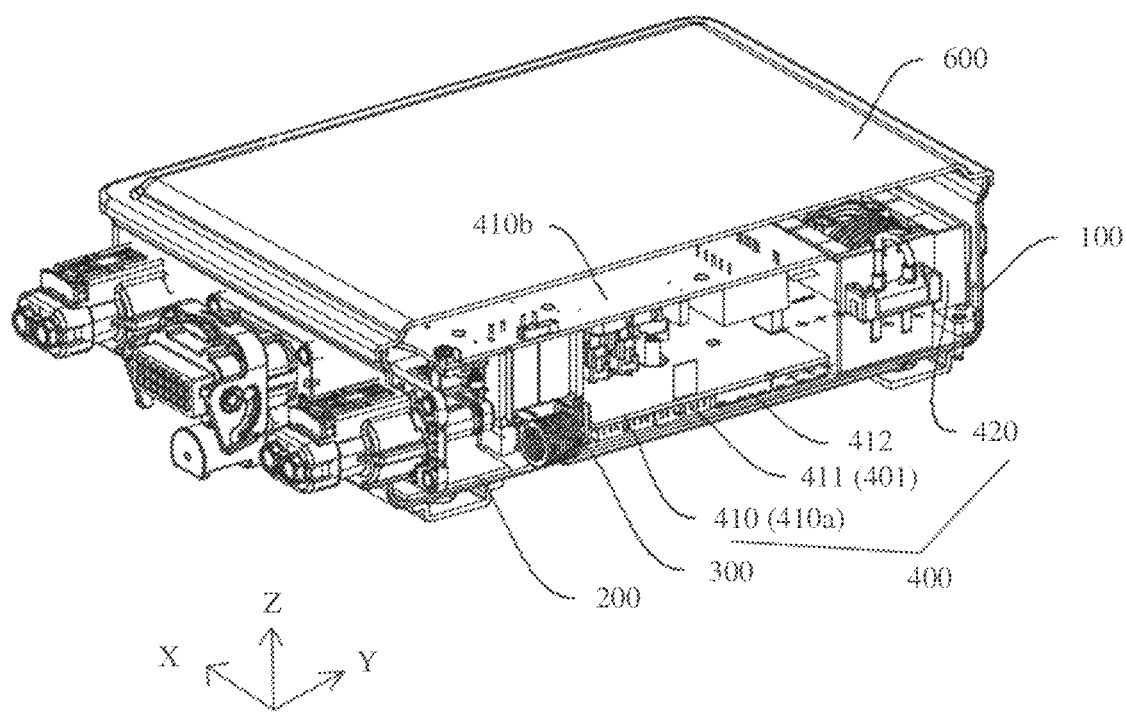
FIG. 2b is a schematic diagram of a sectional structure of a power supply conversion apparatus according to an implementation of this application.

Referring to FIG. 2b, the power supply conversion functional assembly 400 includes a circuit board 410, a magnetic component. 420, and the like. Heat generating components 401 of the power supply conversion functional assembly 400 include an insulated gate bipolar transistor 411, a triode 412, a MOS transistor, and the like located on the circuit board 410. The heat generating components 401 further include an inductor component, a transformer, or the like in the magnetic component 420. One function of the circuit board 410 is to connect the insulated gate bipolar transistor 411, the triode 412, the MOS transistor, the magnetic component 420, and the like. Because the power supply conversion functional assembly 400 has a plurality of components, these components need to be fixed in the accommodation cavity 101 of the housing 100. For the housing formed by using the die casting process, a fixing post may be directly formed on an inner wall of the housing by die casting. The fixing post is configured to fix a component. However, there is usually a large quantity of fixing posts, which increase die costs and process complexity of die casting. When the housing 100 is formed by using the deep drawing process, a fixing post configured to fix a component cannot be integrally formed on an inner surface of the housing 100, but needs to be welded on the inner surface of the housing 100. Usually, the fixing post is first welded or fixed by using adhesive to the inner surface of the housing 100, and then the power supply conversion functional assembly 400 is fixed by using the fixing post, to fix the power supply conversion functional assembly 400 to the housing 100. In this manner, the fixing posts need to be fixed one by one on the inner surface of the housing 100. In one aspect, an end face size of the fixing post is usually small, and fixing to the inner surface of the housing 100 is unstable. In another aspect, if the fixing posts are welded one by one to the housing 100 or are bonded one by one to the housing by using adhesive, a welding process is time-consuming and complex. In still another aspect, when a material of the housing 100 formed by using the deep drawing process or the die casting process is aluminum, stability of direct welding on the aluminum housing 100 is poor, a welding yield is low, and stability of direct bonding on the aluminum housing 100 by using adhesive is also poor.

In this application, at least a part of a surface of the fixing plate 200 that faces the housing 100 is fixedly connected to at least a part of an inner surface of the housing 100. A manner of the fixed connection includes welding or adhesive bonding. The fixed connection between the surface of the fixing plate 200 and the surface of the housing 100 can improve connection stability. Compared with a manner of connection between a small-size end face of a stud and the inner surface of the housing 100, the manner of face-to-face connection between the surface of the fixing plate 200 and the surface of the housing 100 has a large connection area, and higher connection stability. Then, the fixing plate 200 and the power supply conversion functional assembly 400 are fixedly connected to each other, to fix the power supply conversion functional assembly 400 in the accommodation cavity 101 inside the housing 100. Compared with the manner of forming the fixing post by using the die casting process, a process of using the fixing plate 200 is simpler, and process costs are low.

In an implementation, the entire surface of the fixing plate 200 that faces the housing 100 is fixedly connected to the inner surface of the housing 100, to improve stability of the connection between the fixing plate 200 and the housing 100. In an implementation, a part of the surface of the fixing plate 200 that faces the housing 100 is fixedly connected to the inner surface of the housing 100.

Figure 4:
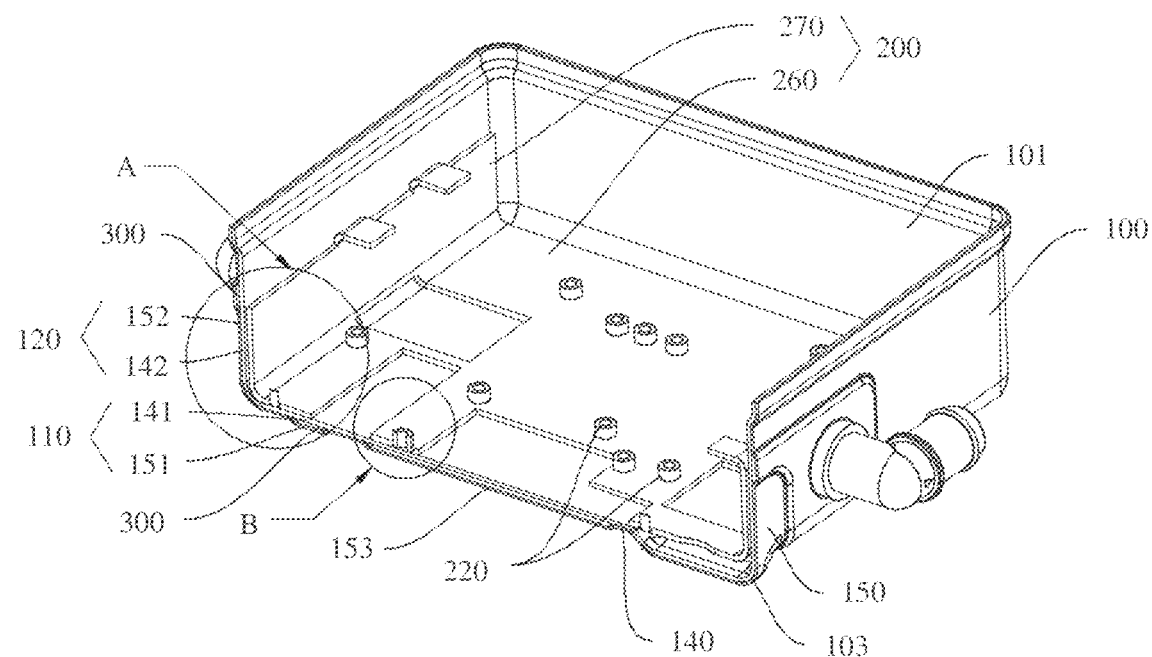
FIG. 4 is a schematic diagram of a sectional structure of a power supply enclosure according to an implementation of this application.
Figure 5A:
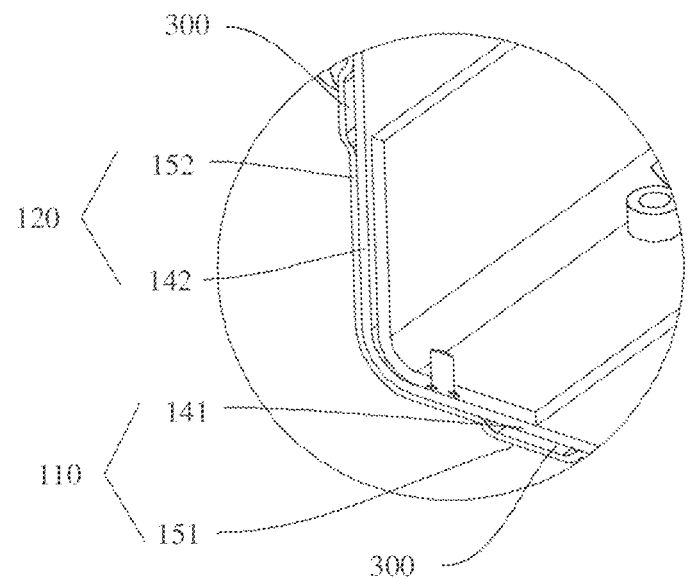
FIG. 5a is a locally enlarged view of a part A in FIG. 4 according to this application.
Figure 5B:
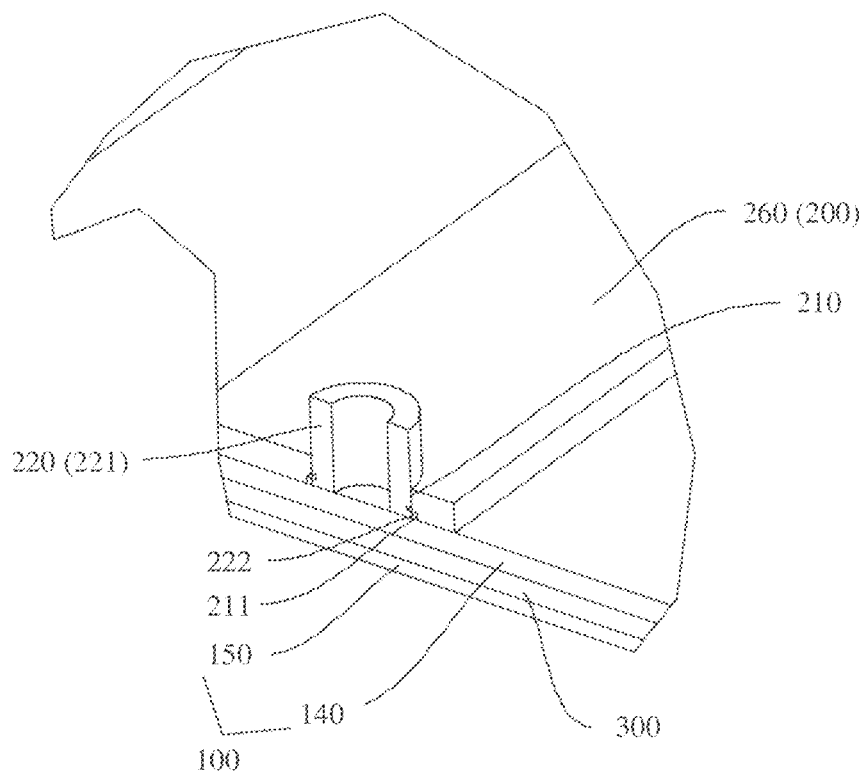
FIG. 5b is a locally enlarged view of a part B in FIG. 4 according to this application.

Referring to FIG. 4 and FIG. 5b, in a possible implementation, the fixing plate 200 is provided with a fixing hole 210 running through two opposite surfaces of the fixing plate 200 (as shown in FIG. 5b). The fixing hole 210 is internally provided with a fixing sub-member 220. The fixing hole 210 cooperates with the fixing sub-member 220 to tix the power supply conversion functional assembly 400.

Sizes and quantities of fixing holes 210 and fixing sub-members 220 may be set based on sizes and a quantity of functional components in the power supply conversion functional assembly 400, so that each component in the power supply conversion functional assembly 400 can be stably fixed in the housing 10. As shown in FIG. 4, the fixing plate 200 has a plurality of fixing sub-members 220. The fixing sub-member 220 may be a stud or a riveting member. A manner of coordinated fixing between the fixing sub-member 220 and the fixing hole 210 may be a threaded connection or a riveting connection. When the manner of the coordinated fixing is threaded connection, the fixing sub-member 220 is a stud, and an internal thread matching the stud is provided on an inner wall of the fixing hole 210. When the manner of the coordinated fixing is riveting connection, the fixing sub-member 220 is a riveting member 221 (as shown in FIG. 5b). One end of the fixing hole 210 that faces the housing 100 is provided with a groove 211 recessed toward a hole wall of the fixing hole 210. One side of the riveting member 221 that is close to the housing 100 is provided with a protrusion part 222 circumferentially protruding toward the riveting member 221, and the protrusion part 222 is located in the groove 211 to fix the riveting member 221 in the fixing hole 210. When there are a plurality of fixing sub-members 220, a height of each fixing sub-member 220 may be set based on a requirement. A height of at least one of the plurality of fixing sub-members 220 may be set to be low, for example, fixing sub-members 220 shown in FIG. 10. A height of at least one of the fixing sub-members may be set to be high, for example, fixing sub-members 230 shown in FIG. 10.

In an implementation, an area of the surface of the fixing plate 200 that faces the housing 100 is greater than ¼ of an area of the inner surface of the housing 100, so that the fixing plate 200 has an enough area to mount an abundant quantity of fixing sub-members 220.

Figure 6:
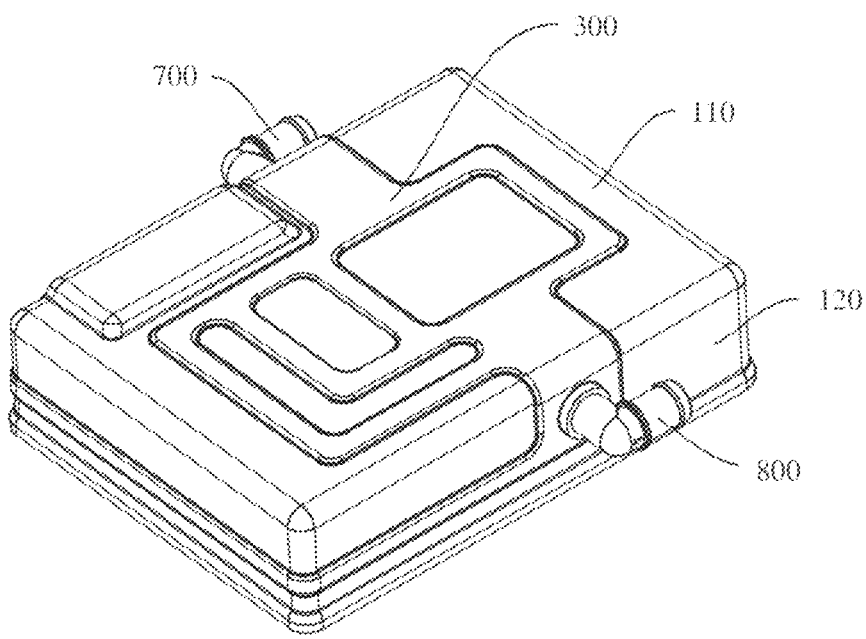
FIG. 6 is a schematic diagram of a three-dimensional structure of a power supply enclosure according to an implementation of this application.

Referring to FIG. 1 and FIG. 6, in a possible implementation, the housing 100 includes a bottom plate 110 and a peripheral side plate 120 that is located on one side of the bottom plate 110 and that surrounds the bottom plate 110. The bottom plate 110 and the peripheral side plate 120 form the accommodation cavity 101 through enclosure. The fixing plate 200 includes a first fixing sub-plate 260 stacked with the bottom plate 110 (as shown in FIG. 1). At least a part of a surface of the first fixing sub-plate 260 that faces the bottom plate 110 is fixedly connected to at least a part of an inner surface of the bottom plate 110. An area of the surface of the first fixing sub-plate 260 that faces the bottom plate 110 is greater than or equal to 0.5 times an area of the surface of the bottom plate 110 that faces the first fixing sub-plate 260, and is less than or equal to the area of the surface of the bottom plate 110 that faces the first fixing sub-plate 260.

In this implementation, the peripheral side plate 120 is perpendicular to the bottom plate 110, and when the housing 100 is formed by using the deep drawing process, the peripheral side plate 120 can be disposed perpendicular to the bottom plate 110. In this implementation, when the housing 100 is formed by using the deep drawing process, a junction between the peripheral side plate 120 and the bottom plate 110 is a fillet 103 (as shown in FIG. 4). In an implementation, the peripheral side plate 120 deviates from a direction perpendicular to the bottom plate 110 by an angle. When the housing 100 is formed by using the die casting process, the peripheral side plate 120 has a pattern draft, so that the peripheral side plate 120 deviates from the direction perpendicular to the bottom plate 110 by an angle.

Figure 7:
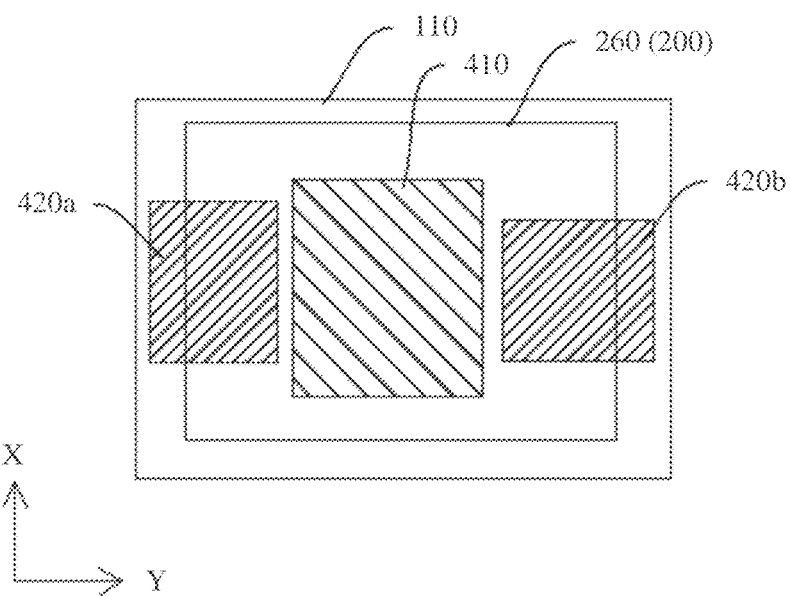
FIG. 7 is a schematic diagram of structures of parts including a bottom plate, a fixing plate, and a power supply conversion functional assembly in a power supply enclosure according to an implementation of this application.
Figure 8:
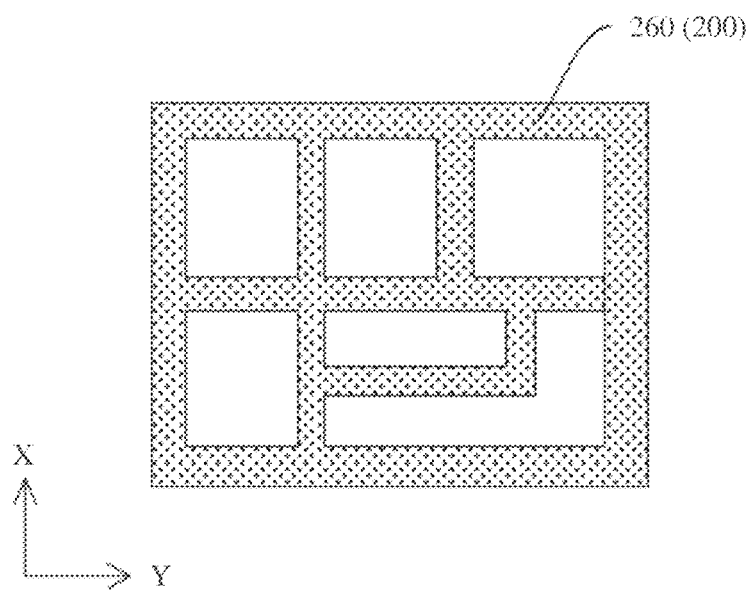
FIG. 8 is a schematic diagram of a structure of a fixing plate in a power supply enclosure according to an implementation of this application.

The area of the first fixing sub-plate 260 is set to be greater than half the area of the bottom plate 110, and this helps fix the power supply conversion functional assembly 400. Because the power supply conversion functional assembly 400 has many scattered functional components, including but not limited to a circuit board 410, an inductor component, a transformer, and the like, when these functional components are distributed in the left, right, front, rear, or middle of the accommodation cavity 101, the area of the first fixing sub-plate 260 cannot be too small. The area of the surface of the first fixing sub-plate 260 that faces the bottom plate 110 is greater than or equal to 0.5 times the area of the surface of the bottom plate 110 that faces the first fixing sub-plate 260. In this way, the first fixing sub-plate 260 has enough area to mount an abundant quantity of fixing sub-members 220, to fix each functional component in the power supply conversion functional assembly 400. FIG. 7 is a schematic diagram of structures of parts of the bottom plate 110 and the power supply conversion functional assembly 400. In an implementation, the area of the surface of the first fixing sub-plate 260 that faces the bottom plate 110 is 0.8 times the area of the surface of the bottom plate 110 that faces the first fixing sub-plate 260. The power supply conversion functional assembly 400 includes two magnetic components 420 and one circuit board 410. The two magnetic components 420 are respectively denoted as 420a and 420b, and the circuit board 410 is located between the two magnetic components 420. Because the first fixing sub-plate 260 occupies most of the area of the bottom plate 110, the two magnetic components 420 and the circuit board 410 can be fixed on the fixing plate 200 by using the fixing sub-members 220. In some implementations, when the area of the first fixing sub-plate 260 is small, the first fixing sub-plate 260 may be patterned (as shown in FIG. 8), so that the first fixing sub-plate 260 can fix a functional component that is in the power supply conversion functional assembly 400 and that faces the bottom plate 110. A specific pattern may be designed based on arrangement locations and a quantity of components in the power supply conversion functional assembly 400.

Figure 9:
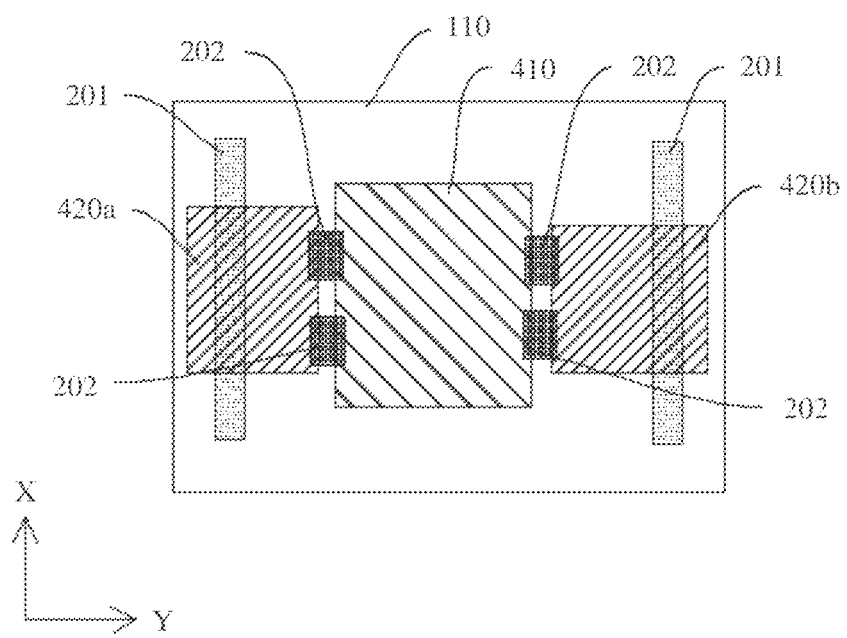
FIG. 9 is a schematic diagram of structures of parts including a bottom plate, a support member, and a power supply conversion functional assembly according to an implementation.

FIG. 9 is a schematic diagram of structures of parts of the bottom plate 110 and the power supply conversion functional assembly 400. In some implementations, two long strip-shaped support members 201 are used to support and fix the power supply conversion functional assembly 400. The two support members 201 are distributed on two sides of the bottom plate 110. The support members 201 can only fix and support the magnetic components 420a and 420b on two sides of the accommodation cavity 101, but cannot fix the circuit board 410 in the middle of the accommodation cavity 101. Instead, one side of the circuit board 410 can be fixed to the magnetic component 420a by welding or by using a fixing member 202, and the other side of the circuit board 410 can be fixed to the magnetic component 420b by welding or by using a fixing member 202, and this increases costs. In addition, stability of the side-surface fixing between the circuit board 410 and the magnetic component 420 is poorer than stability of the bottom-surface fixing between the circuit board 410 and the fixing plate 200. Therefore, for the power supply conversion functional assembly 400 which has many scattered functional components, the fixing plate 200 with a large area is used for fixing and support, improving stability of the fixed connection.

Still referring to FIG. 1, in a possible implementation, the fixing plate 200 further includes a second fixing sub-plate 270. The second fixing sub-plate 270 is located on an inner side of the peripheral side plate 120, and intersects the first fixing sub-plate 260. At least a part of a surface of the second fixing sub-plate 270 that faces the peripheral side plate 120 is fixedly connected to at least a part of an inner surface of the peripheral side plate 120. The second fixing sub-plate 270 can fix the power supply conversion functional assembly 400 from a side, for example, can fix a surface of a magnetic component 420 that faces the peripheral side plate 120, thereby improving stability of a fixed connection. The second fixing sub-plate 270 intersects the first fixing sub-plate 260, and this includes that the second fixing sub-plate 270 intersects the first fixing sub-plate 260 perpendicularly, or the second fixing sub-plate 270 deviates from a direction perpendicular to the first fixing sub-plate 260 by an angle. For example, in an implementation, a value of an included angle between the second fixing sub-plate 270 and the first fixing sub-plate 260 is greater than or equal to 80° and less than 90°. The second fixing sub-plate 270 may be configured to fix a part that is of the power supply conversion functional assembly 400 and that has a distance from the peripheral side plate 120.

In an implementation, the second fixing sub-plate 270 and the first fixing sub-plate 260 are an integrated structure. In other words, the fixing plate 200 is an integrated structure. A material of the fixing plate 200 is aluminum. In an implementation, a shape of the fixing plate 200 matches the housing 100, and the fixing plate 200 is attached to the inner wall of the housing 100. The fixing plate 200 may be formed by using the deep drawing process, or the fixing plate 200 may be formed by a bending process.

Figure 10:
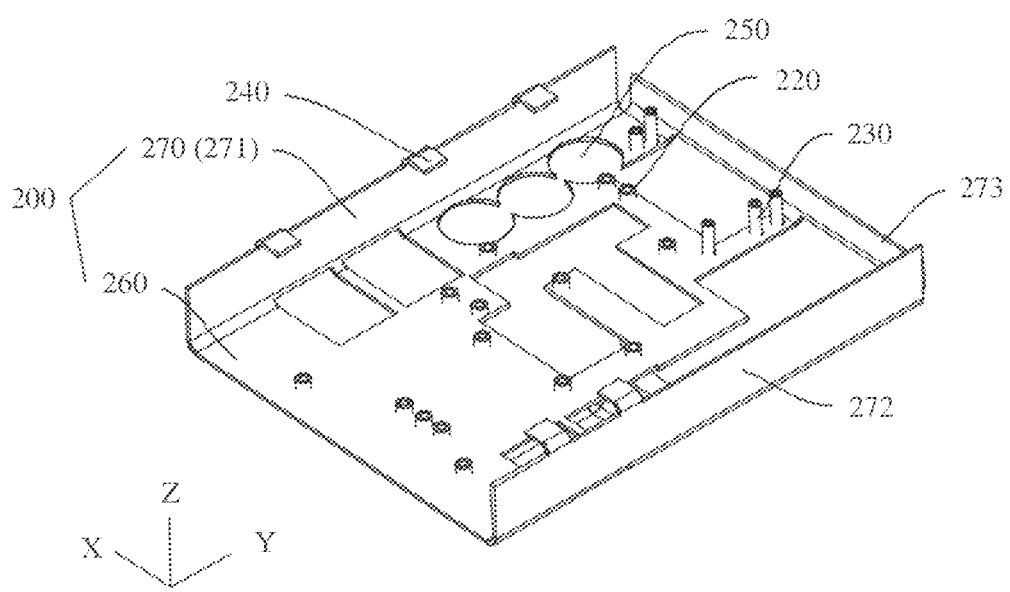
FIG. 10 is a schematic diagram of a structure of a fixing plate in a power supply enclosure according to an implementation of this application.

In an implementation, the second fixing sub-plate 270 includes a first part 271 and a second part 272 that are disposed opposite to each other in a first direction X (as shown in FIG. 10). The peripheral side plate 120 includes a first side plate 121 and a second side plate 122 that are disposed opposite to each other in the first direction X (as shown in FIG. 1). The first part 271 is located on a surface of the first side plate 121 that faces the accommodation cavity 101, and the second part 272 is located on a surface of the second side plate 122 that faces the accommodation cavity 101. The first part 271, the first fixing sub-plate 260, and the second part 272 are an integrated structure. In this implementation, the first part 271 and the second part 272 are respectively fixedly connected to the first side plate 121 and the second side plate 122 to tix the second fixing sub-plate 270 to the peripheral side plate 120. The second fixing sub-plate 270 includes only the first part 271 and the second part 272, and therefore costs can be reduced while connection reliability is ensured. In some implementations, the second fixing sub-plate 270 further includes a third part 273 disposed on a side that is of the first fixing sub-plate 260 and that is in a second direction Y (as shown in FIG. 10). The third part 273 is configured to fix a surface that is on a side of the power supply conversion functional assembly 400 and that is in the second direction Y. The second direction Y intersects the first direction X. In a specific implementation, the first direction X is a width direction of the power supply enclosure 10, the second direction Y is a length direction of the power supply enclosure 10, and the second direction Y intersects the first direction X perpendicularly. In some implementations, the first direction X is a length direction of the power supply enclosure 10, and the second direction Y is a width direction of the power supply enclosure 10.

In an implementation shown in FIG. 1, the fixing plate 200 is fixedly connected to both the bottom plate 110 and the peripheral side plate 120 of the housing 100. In this way, an area of the fixed connection is increased, and stability of the fixed connection is improved.

Still referring to FIG. 1, in an implementation, one end of the second fixing sub-plate 270 that is away from the first fixing sub-plate 260 is provided with a fixing piece 240, and the fixing piece 240 extends from the second fixing sub-plate 270 to the middle of the accommodation cavity 101. The fixing piece 240 is configured to fix a functional component that is in the power supply conversion functional assembly 400 and that is disposed away from the bottom plate 110. In an implementation, the power supply conversion functional assembly 400 includes two circuit boards 410 that are disposed opposite to each other in a third direction Z (as shown in FIG. 2b). The third direction Z intersects the first direction X and the second direction Y perpendicularly. The third direction Z is a height direction of the power supply enclosure 10. The two circuit boards are respectively denoted as 410a and 410b. The circuit board 410a is fixedly connected to the first fixing sub-plate 260, and the circuit board 410b is located on one side of the fixing piece 240 that is away from the bottom plate 110, and is fixedly connected to the fixing piece 240. Specifically, a hole may be opened on the fixing piece 240, and the circuit board 410b is fixed to the fixing piece 240 by using a stud or a riveting member.

Figure 11:
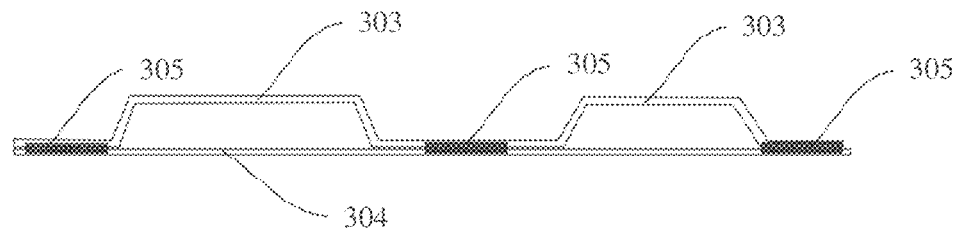
FIG. 11 is a schematic diagram of a structure of a flow channel formed by using a die casting process.

Still referring to FIG. 4, in a possible implementation, parts of the housing 100 except the first flow channel 300 are an integrated structure. In the housing 100 of the integrated structure, the bottom plate 110 and the peripheral side plate 120 are continuous, and no welding member or fixing member is required. In this way, costs can be reduced, and air-tightness of the first flow channel 300 is good. Referring to FIG. 11, in some implementation, a groove channel 303 is formed by using the die casting process, and then the flow channel is formed by covering the groove channel 303 with a sealing plate 304. A sealing location 305 between the sealing plate 304 and the groove channel 303 needs to be welded by friction stir welding or bonded by using adhesive. Consequently, air-tightness of the flow channel is poor, and stability of welding or adhesive bonding is poor after long-term use. In addition, cooling water is more sensitive to defects such as an air hole, shrinkage porosity, and a crack in the groove channel 303 formed by die casting, and a risk of water leakage is high. In this implementation, the parts of the housing 100 except those forming the first flow channel 300 are an integrated structure, in other words, an edge of the first flow channel 300 is integrated. Therefore, air-tightness is good, and the risk of water leakage can be avoided.

Still referring to FIG. 4, in a possible implementation, the housing 100 includes a first sub-housing 140 and a second sub-housing 150, the first sub-housing 140 is nested in the second sub-housing 150, a cavity of the first sub-housing 140 is the accommodation cavity 101, the first sub-housing 140 is fixedly connected to the fixing plate 200, the first flow channel 300 is located between the first sub-housing 140 and the second sub-housing 150, and parts of the first sub-housing 140 and the second sub-housing 150 except those forming the first flow channel 300 are hot-rolled and fused into an integrated structure.

Figure 12:
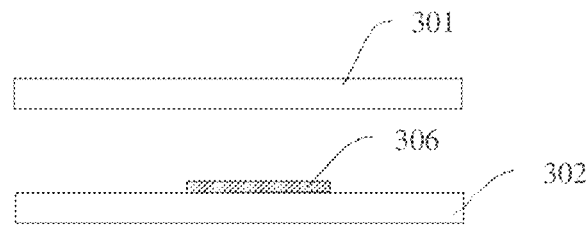
FIG. 12 is a schematic diagram of a step of printing graphite rolling inhibitor in a method for preparing a power supply enclosure according to an implementation of this application.
Figure 13:
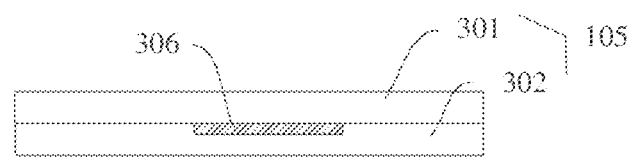
FIG. 13 is a schematic diagram of a hot rolling step in a method for preparing a power supply enclosure according to an implementation of this application.
Figure 14:
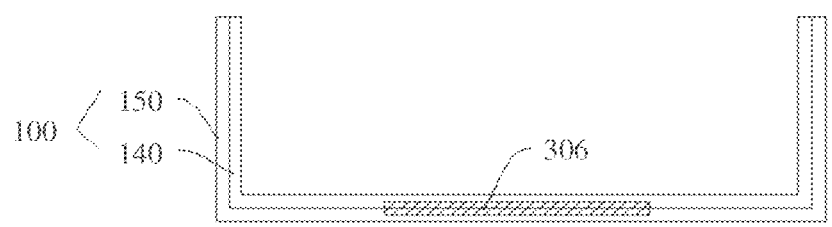
FIG. 14 is a schematic diagram of a deep drawing step in a method for preparing a power supply enclosure according to an implementation of this application.
Figure 15:
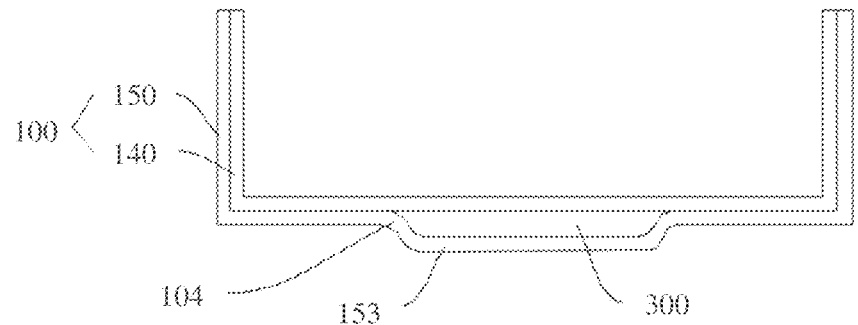
FIG. 15 is a schematic diagram of an inflating step in a method for preparing a power supply enclosure according to an implementation of this application.

The first flow channel 300 may be formed by using an inflating process. Specifically, graphite rolling inhibitor is printed first (as shown in FIG. 12): graphite rolling inhibitor 306 is printed at a location at which the first flow channel 300 needs to be formed between a first sheet 301 and a second sheet 302. Different patterns made based on heat dissipation requirements are printed on an interlayer between the first sheet 301 and the second sheet 302. For hot rolling (as shown in FIG. 13): parts without the printed graphite rolling inhibitor 306 are hot rolled and fused together to form a housing prefabricated plate 105. The first sheet 301 and the second sheet 302 having the graphite rolling inhibitor 306 are still in a separate state after the hot rolling. For deep drawing (as shown in FIG. 14): the hot-rolled housing prefabricated plate 105 forms the housing 100 by using the deep drawing process. The first sheet 301 and the second sheet 302 respectively form the first sub-housing 140 and the second sub-housing 150 by using the deep drawing process. Parts of the first sub-housing 140 and the second sub-housing 150 except those forming the first flow channel 300 are hot-rolled and fused into an integrated structure. For inflating (as shown in FIG. 15): by using the inflating process, local deformation is generated when a location having the printed graphite rolling inhibitor 306 is inflated. The second sub-housing 150 protrudes outwardly to form a second protrusion part 153 protruding in a direction away from the first sub-housing 140. The second protrusion part 153 and the first sub-housing 140 jointly form the closed first flow channel 300.

Figure 16:
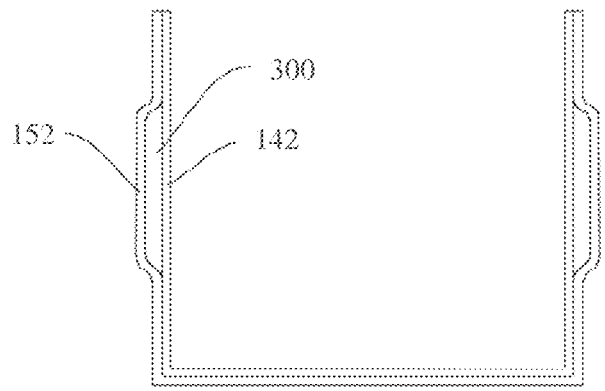
FIG. 16 is a schematic diagram of a structure of a housing in a power supply enclosure according to an implementation of this application.
Figure 17:
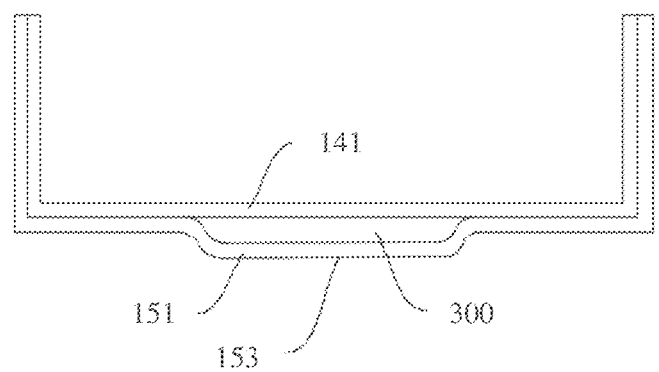
FIG. 17 is a schematic diagram of a structure of a housing in a power supply enclosure according to an implementation of this application.

Still referring to FIG. 4 and FIG. 5a, the first sub-housing 140 includes a first bottom wall 141 and a first side wall 142 that is located on one side of the first bottom wall 141 and that is disposed around the first bottom wall 141. The second sub-housing 150 includes a second bottom wall 151 and a second side wall 152 that is located on one side of the second bottom wall 151 and that is disposed around the second bottom wall 151. The first bottom wall 141 and the second bottom wall 151 are stacked to jointly form the bottom plate 110. The first side wall 142 and the second side wall 152 are stacked to jointly form the peripheral side plate 120. A part of the first flow channel 300 is located between the first bottom wall 141 and the second bottom wall 151. A part of the first flow channel 300 is located between the first side wall 142 and the second side wall 152. In some implementations, the first flow channel 300 may be located only between the first side wall 142 and the second side wall 152 (as shown in FIG. 16), and is disposed around the entire first side wall 142. In some implementations, the first flow channel 300 may be located only between the first bottom wall 141 and the second bottom wall 151 (as shown in FIG. 17), and a pattern of the first flow channel 300 may be set based on an actual requirement.

Materials of the first sub-housing 140 and the second sub-housing 150 are aluminum. Aluminum is inexpensive, and has a large coefficient of thermal conductivity. Copper is expensive, and a coefficient of thermal conductivity of stainless steel is small.

Figure 18:
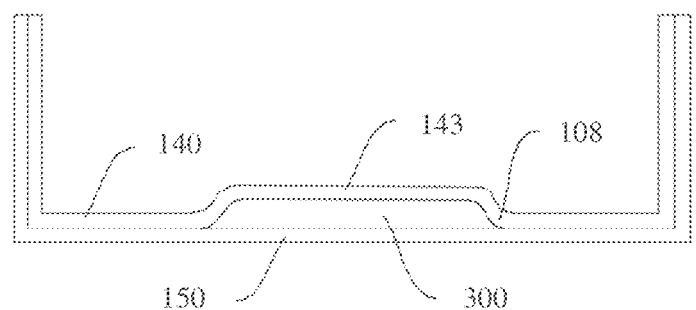
FIG. 18 is a schematic diagram of a structure of a housing in a power supply enclosure according to an implementation of this application.

Referring to FIG. 18, in a possible implementation, the first sub-housing 140 includes a first protrusion part 143 protruding in a direction away from the second sub-housing 150, and the second sub-housing 140 and the first protrusion part 143 form the first flow channel 300. In this implementation, a thickness of the first protrusion part 143 is less than a thickness of another part of the second sub-housing 140. The thickness is a size in a direction perpendicular to the first protrusion part 143 or the second sub-housing 140. In an implementation, a thickness of the second sub-housing 140 is 1.5 mm, and the thickness of the first protrusion part 143 is 1 mm. In an implementation, when the first protrusion part 143 is formed by using the deep drawing process, a junction between the first protrusion part 143 and a part of the first sub-housing 140 except the first protrusion part 143 is a fillet 108 (as shown in FIG. 18).

Still referring to FIG. 15, in a possible implementation, the second sub-housing 150 includes a second protrusion part 153 protruding in a direction away from the first sub-housing 140, and the first sub-housing 140 and the second protrusion part 153 form the first flow channel 300. In an implementation, when the second protrusion part 153 is formed by using the deep drawing process, a junction between the second protrusion part 153 and a part of the second sub-housing 150 except the second protrusion part 153 is a fillet 104 (as shown in FIG. 15).

Figure 19:
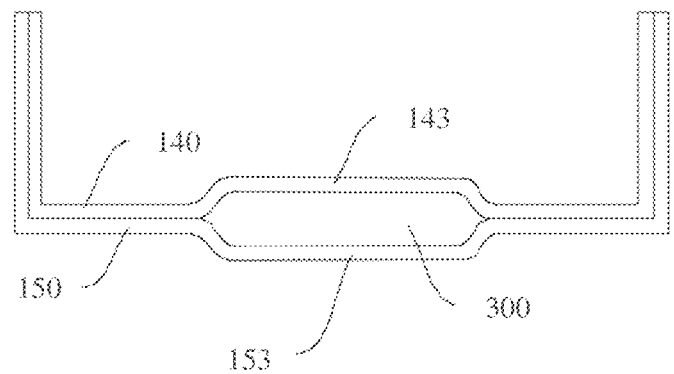
FIG. 19 is a schematic diagram of a structure of a housing in a power supply enclosure according to an implementation of this application.

Referring to FIG. 19, in a possible implementation, the first sub-housing 140 includes a first protrusion part 143 protruding in a direction away from the second sub-housing 150. The second sub-housing 150 includes a second protrusion part 153 protruding in a direction away from the first sub-housing 140. The first protrusion part 143 and the second protrusion part 153 are disposed oppositely and connected to each other to jointly form the first flow channel 3010.

Figure 20:
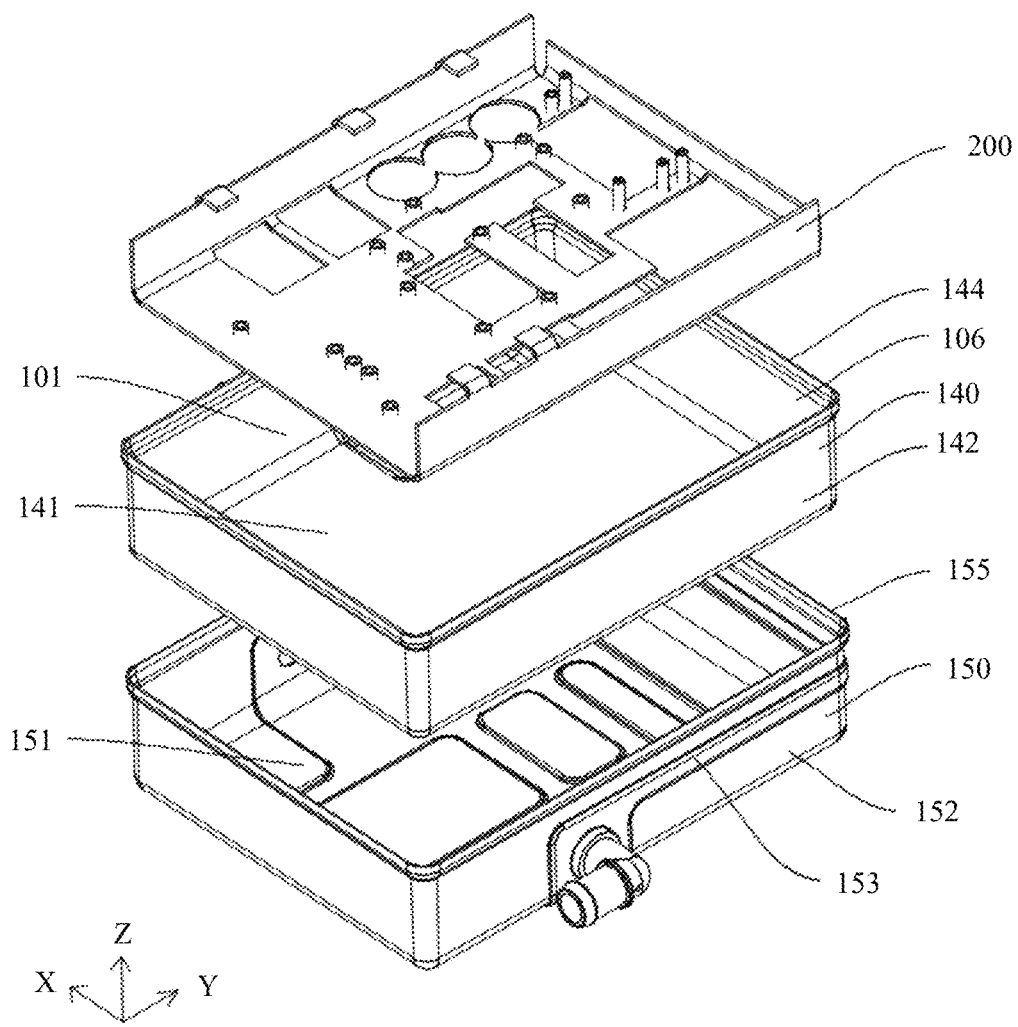
FIG. 20 is a three-dimensional exploded view of a power supply enclosure according to an implementation of this application.

Referring to FIG. 20, in a possible implementation, the housing 100 includes a first sub-housing 140 and a second sub-housing 150, the first sub-housing 140 is nested in the second sub-housing 150, a cavity of the first sub-housing 140 is the accommodation cavity 101, the first sub-housing 140 is fixedly connected to the fixing plate 200, the first flow channel 300 is located between the first sub-housing 140 and the second sub-housing 150, and an edge of an opening 144 of the first sub-housing 140 is sealed with an edge of an opening 155 of the second sub-housing 150. The first sub-housing 140 is a groove structure formed by a first bottom wall 141 and a first side wall 142, and an opening of the groove structure is the opening 144 of the first sub-housing 140. The second sub-housing is a groove structure formed by a second bottom wall 151 and a second side wall 152, and an opening of the groove structure is the opening 155 of the second sub-housing 150.

The first sub-housing 140 and the second sub-housing 150 separately form integrated structures by using the deep drawing process, and the first flow channel 300 is formed by using the deep drawing process. Specifically, the first sheet 301 forms the first sub-housing 140 by using the deep drawing process. The second sheet 302 forms the second sub-housing 150 by using the deep drawing process, and forms the second protrusion part 153 by using the deep drawing process. A size and a shape of the first sub-housing 140 match those of the second sub-housing 150. Then, the first sub-housing 140 is nested in the second sub-housing 150, and the second protrusion part 153 and the first sub-housing 140 form the first flow channel 300. Finally, the edge of the opening 144 of the first sub-housing 140 and the edge of the opening 155 of the second sub-housing 150 are welded by using a welding flange or sealed by using a sealant. The edge of the opening 144 of the first sub-housing 140 is an edge at one end of the first side wall 142 that is away from the first bottom wall 141. The edge of the opening 155 of the second sub-housing 150 is an edge at one end of the second side wall 152 that is away from the second bottom wall 151. In this implementation, only the edges of the first sub-housing 140 and the second sub-housing 150 need to be connected to each other by sealing, and other parts may be locally welded for structural reinforcement. In this way, local welding locations do not damage the integrated structures of the first sub-housing 140 and the second sub-housing 150, air-tightness is good, and production efficiency of deep-drawing forming is high.

It should be noted that, the first flow channel 300 formed by using the deep drawing process may be formed by the second sub-housing 150 and the first protrusion part 143, or may be formed by the first sub-housing 140 and the second protrusion part 153, or may be formed by the first protrusion part 143 and the second protrusion part 153.

Still referring to FIG. 10, in a possible implementation, the fixing plate 200 is provided with an avoidance hole 250 running through two opposite surfaces of the fixing plate 200. A projection of the avoidance hole 250 on the first sub-housing 140 in a thickness direction of the first sub-housing 140 at least partially overlaps a projection of the first flow channel 300 on the first sub-housing 140 in the thickness direction of the first sub-housing 140. The avoidance hole 250 is configured to accommodate at least one of the heat generating components 401. The thickness direction of the first sub-housing 140 is a direction perpendicular to a part that is of the first sub-housing 140 and in which the first flow channel 300 is located. When the avoidance hole 250 is located on the first fixing sub-plate 260, the thickness direction of the first sub-housing 140 is a direction perpendicular to the first bottom wall 141 (as shown in FIG. 20), that is, a third direction Z in FIG. 20. When the avoidance hole 250 is located on the second fixing sub-plate 270, the thickness direction of the first sub-housing 140 is a direction perpendicular to the first side wall 142.

Figure 21:
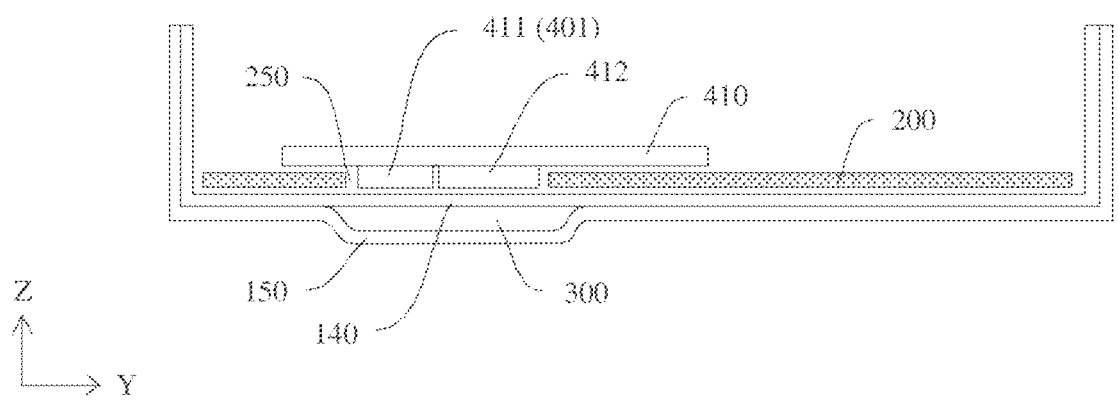
FIG. 21 is a schematic diagram of locations of a power supply enclosure and a circuit board according to an implementation of this application.

The heat generating components 401 on the circuit board 410, such as the insulated gate bipolar transistor 411, the triode 412, and the MOS transistor, are disposed by protruding from a surface of the circuit board 410. When the circuit board 410 is placed on the fixing plate 200, the heat generating components 401 may cause untight attachment between the surface of the circuit board 410 and the surface of the fixing plate 200. When the heat generating components 401 are accommodated in the avoidance hole 250 (as shown in FIG. 21), in one aspect, the surface of the circuit board 410 can be tightly attached to the surface of the fixing plate 200, and in another aspect, the first flow channel 300 below the avoidance hole 250 can directly cool the heat generating components 401 in the avoidance hole 250, thereby improving a cooling effect. In some implementations, the heat generating component 401 may alternatively be an inductor component or a transformer in the magnetic component 420. The magnetic component 420 may also be disposed in the avoidance hole 250. The circuit board 410 is fixedly connected to the fixing plate 200 face to face. At least one of the insulated gate bipolar transistor, the triode, and the MOS transistor may be disposed in the avoidance hole 250. A quantity and sizes of avoidance holes 250 may be set based on a quantity and sizes of the heat generating components 401.

Figure 22:
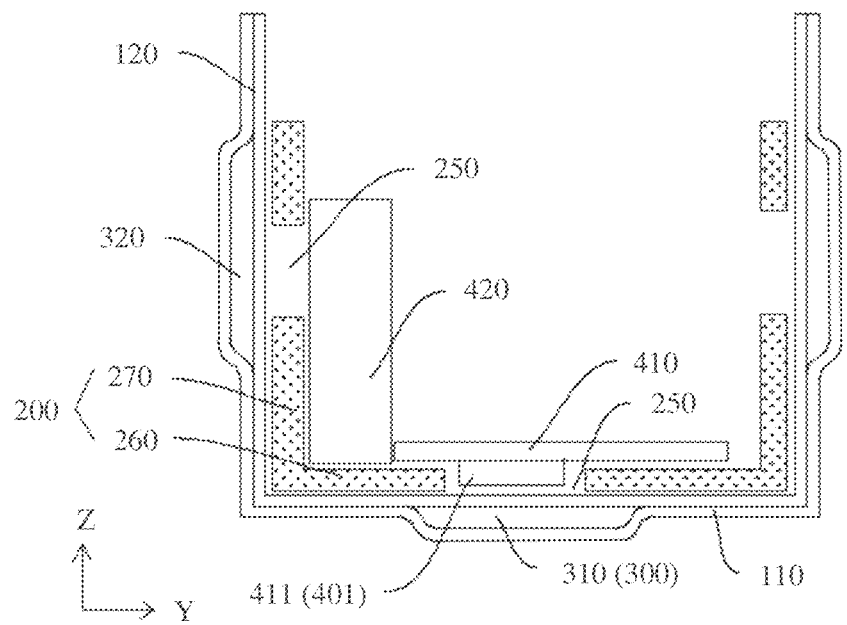
FIG. 22 is a schematic diagram of locations of a power supply enclosure and a power supply conversion functional assembly according to an implementation of this application.

Referring to FIG. 22, in a possible implementation, the first flow channel 300 includes a first sub-channel 310 located inside the bottom plate 110. The fixing plate 200 includes a first fixing sub-plate 260 disposed opposite to the bottom plate 110 in a third direction Z. At least one avoidance hole 250 is located in the first fixing sub-plate 260. At least a part of the first sub-channel 310 is disposed opposite to the avoidance hole 250 located in the first fixing sub-plate 260 in the third direction Z. In this implementation, the third direction Z is a height direction of the power supply enclosure 10, and the first sub-channel 310 is configured to cool a heat generating component 401 above the bottom plate 110. In the power supply conversion apparatus 20, the circuit board 410 is usually disposed above the bottom plate 110 of the housing 100. The circuit board 410 and the fixing plate 200 are fixed by attaching to each other face to face. The first sub-channel 310 cools the heat generating components 401 such as the insulated gate bipolar transistor 411, the triode 412, and the MOS transistor on the circuit board 410 through the avoidance hole 250.

Still referring to FIG. 22, in a possible implementation, the first flow channel 300 further includes a second sub-channel 320 located inside the peripheral side plate 120. The first sub-channel 310 and the second sub-channel 320 are connected to each other. The fixing plate 200 includes a second fixing sub-plate 270. The second fixing sub-plate 270 is fixedly connected to a surface of the peripheral side plate 120, and is connected to the first fixing sub-plate 260. At least one avoidance hole 250 is located in the second fixing sub-plate 270. At least a part of the second sub-channel 320 is disposed opposite to the avoidance hole 250 located in the second fixing sub-plate 270 in the third direction Z. In this implementation, the second sub-channel 320 is configured to cool the heat generating components 401 on a side of the peripheral side plate 120, such as an inductor and a capacitor in the magnetic components 420. The magnetic components 420 may be disposed adjacent to the peripheral side plate 120, so that the second sub-channel 320 in the peripheral side plate 120 can cool the magnetic components 420 for heat dissipation.

The fixing plate 200 may be provided with a plurality of avoidance holes 250, at least one of the plurality of avoidance holes 250 is located in the first fixing sub-plate 260, and the remaining avoidance hole 250 is located in the second fixing sub-plate 270. For example, the fixing plate 200 is provided with 10 avoidance holes 250, six avoidance holes 250 are located in the first fixing sub-plate 260, and four avoidance holes 250 are located in the second fixing sub-plate 270.

Figure 23:
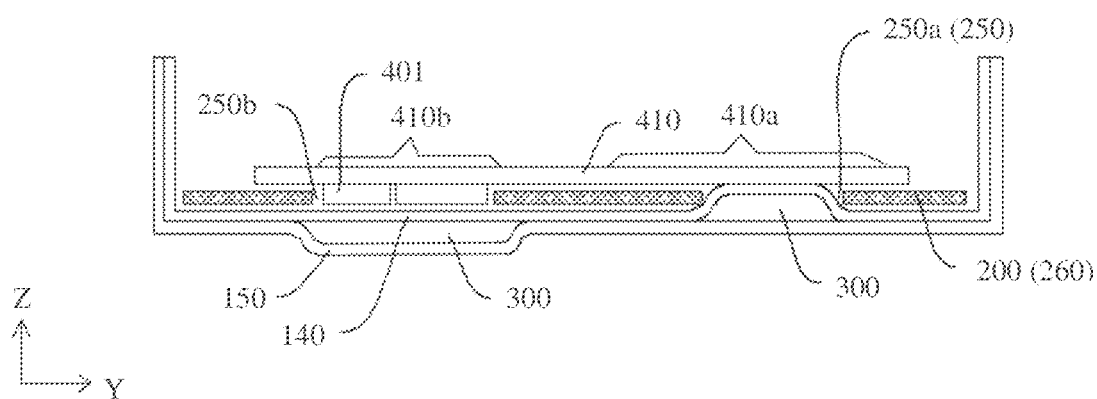
FIG. 23 is a schematic diagram of locations of a power supply enclosure and a circuit board according to an implementation of this application.

Referring to FIG. 23, in a possible implementation, the first sub-housing 140 includes a first protrusion part 143 protruding in a direction away from the second sub-housing 150. The second sub-housing 150 and the first protrusion part 143 form the first flow channel 300. The first protrusion part 143 is located in an avoidance hole 250. The first protrusion part 143 abuts against at least a part of an inner surface of the power supply conversion functional assembly 400 that faces the first sub-housing 140. The first protrusion part 143 is disposed in the avoidance hole 250 to fill the avoidance hole 250, so that the power supply conversion functional assembly 400 is placed flat on the fixing plate 200. In this way, flatness is improved, and a part of the circuit board 410 located at the avoidance hole 250 is prevented from being crushed when being impacted.

For example, when the power supply conversion functional assembly 400 is the circuit board 410, and when the circuit board 410 is placed on the first fixing sub-plate 260, the circuit board 410 includes a part of the circuit board 410a without the insulated gate bipolar transistor 411, the triode 412, the MOS transistor, and the like and includes a part of the circuit board 410b with the heat generating component 401. The first fixing sub-plate 260 includes an avoidance hole 250a and an avoidance hole 250b. A part of the first flow channel 300 protrudes and is disposed in the avoidance hole 250a. A part of the first flow channel 300 in the avoidance hole 250b is located below the first fixing sub-plate 260. A part of 410b with a heat generating component 401 is located above the avoidance hole 250b. In this way, the heat generating component 401 is located in the avoidance hole 250b, and the part of the circuit board 410a without the heat generating components 401 such as the insulated gate bipolar transistor 411, the triode 412, and the MOS transistor is located above the avoidance hole 250a. Although the part of the circuit board 410a is not directly provided with the heat generating component 401, heat generated by heating of the part of the circuit board 410b is transmitted to the part of the circuit board 410a. The part of the first flow channel 300 that protrudes and is disposed in the avoidance hole 250a can cool the part of the circuit board 410a, and the part of the first flow channel 300 can further support the part of the circuit board 410a.

Still referring to FIG. 6, in a possible implementation, the power supply enclosure 10 further includes a liquid inlet nozzle 700 and a liquid outlet nozzle 800. The liquid inlet nozzle 700 and the liquid outlet nozzle 800 are located on two sides of the housing 100, and are connected to the first flow channel 300. Holes may be opened on an outer wall of the housing 100, and the holes are brazed with the liquid inlet nozzle 700 and the liquid outlet nozzle 800 by using a brazing process, to connect to the first flow channel 300. In this implementation, a part of the first flow channel 300 is located in the bottom plate 110, and a part of the first flow channel 300 is located in the peripheral side plate 120. The liquid inlet nozzle 700 and the liquid outlet nozzle 800 are located on an outer side of the peripheral side plate 120, and are connected to the first flow channel 300 in the peripheral side plate 120. In some implementations, the liquid inlet nozzle 700 and the liquid outlet nozzle 800 are located on a same side of the peripheral side plate 120.

Figure 24:
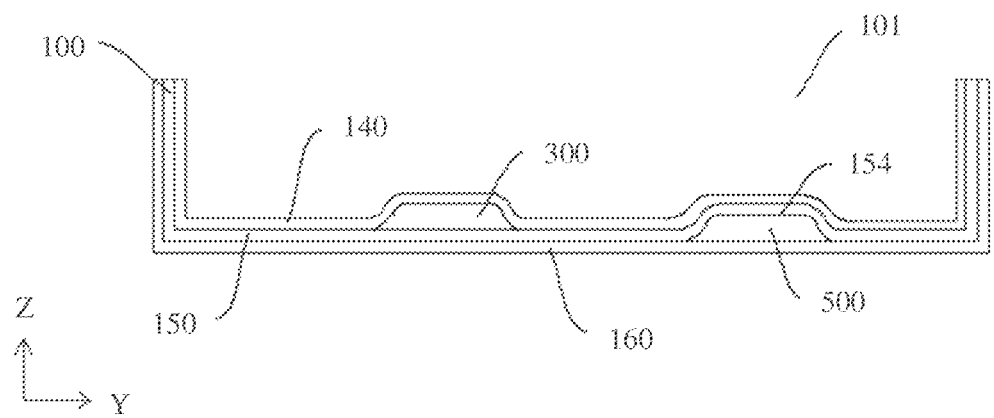
FIG. 24 is a schematic diagram of a stricture of a housing in a power supply enclosure according to an implementation of this application.

Referring to FIG. 24, in a possible implementation, the power supply enclosure 10 further includes a third sub-housing 160, the first sub-housing 140 and the second sub-housing 150 are nested in the third sub-housing 160, and a second flow channel 500 is disposed between the third sub-housing 160 and the second sub-housing 150. In this implementation, the first sub-housing 140 is nested in the second sub-housing 150, and the second sub-housing 150 is nested in the third sub-housing 160. The first flow channel 300 and the second flow channel 500 are disposed, so that a heat dissipation effect is better. The first flow channel 300 is disposed closer to the heat generating components 401 in the power supply conversion functional assembly 400 than the second flow channel 500. The first flow channel 300 cools the heat generating components 401 by heat absorption, and heat from the first flow channel 300 after heat absorption is absorbed by the second flow channel 500, to transfer the heat out. In some implementations, a cooling liquid in the first flow channel 300 and that in the second flow channel 500 may have different temperatures. For example, the temperature of the cooling liquid in the first flow channel 300 is from 10° C. to 15° C., and the temperature of the cooling liquid in the second flow channel 500 is from 5° C. to 10° C. The cooling liquid with a temperature difference can improve heat exchange efficiency between the first flow channel 300 and the second flow channel 500, to further improve heat dissipation efficiency of the heat generating components 401.

Still referring to FIG. 24, in a possible implementation, the second sub-housing 150 includes a third protrusion pan 154 protruding in a direction away from the third sub-housing 160, and the third sub-housing 160 and the third protrusion part 154 form the second flow channel 500. In this implementation, a thickness of the third protrusion part 154 is less than a thickness of the third sub-housing 160. The thickness is a size in a direction perpendicular to the third protrusion part 154 or the third sub-housing 160. In an implementation, the thickness of the third sub-housing 160 is 1.5 mm, and the thickness of the third protrusion part 154 is 1 mm.

Figure 25:
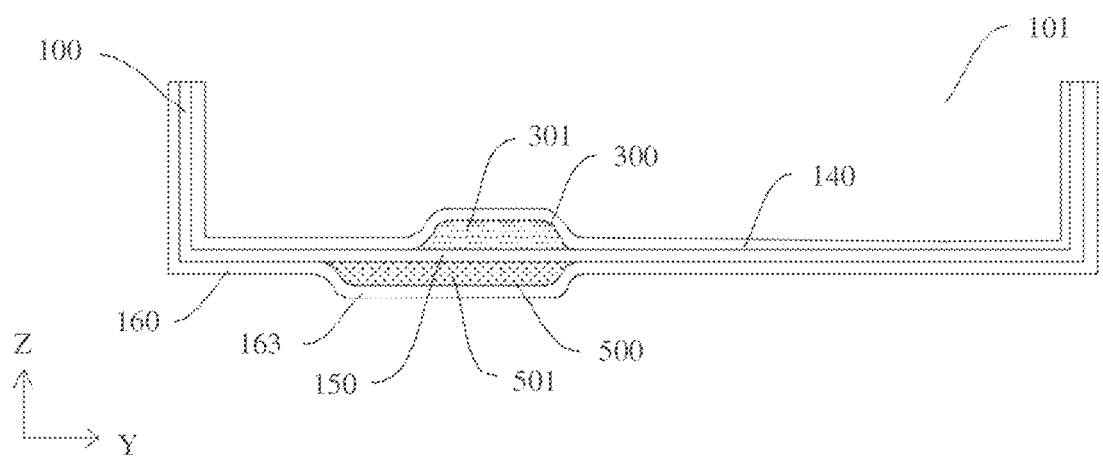
FIG. 25 is a schematic diagram of a structure of a housing in a power supply enclosure according to an implementation of this application.

Referring to FIG. 25, in a possible implementation, the third sub-housing 160 includes a fourth protrusion part 163 protruding in a direction away from the second sub-housing 150, and the second sub-housing 150 and the fourth protrusion part 163 form the second flow channel 500.

Figure 26:
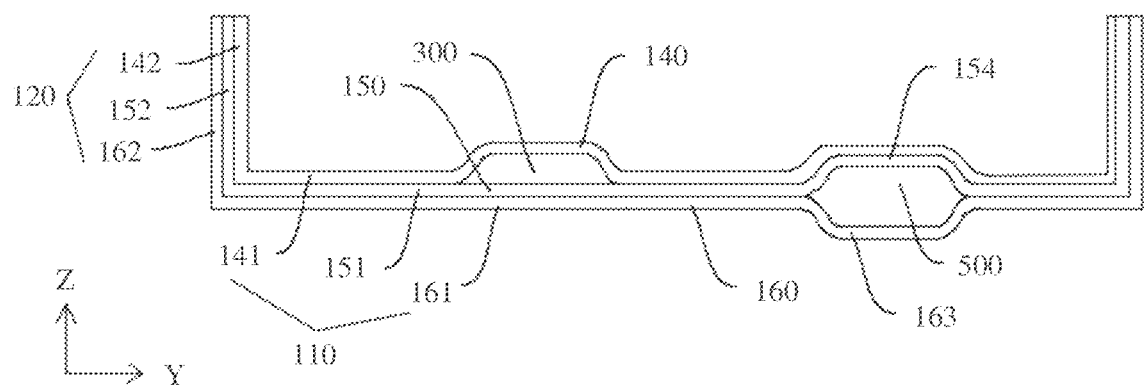
FIG. 26 is a schematic diagram of a structure of a housing in a power supply enclosure according to an implementation of this application.

Referring to FIG. 26, in a possible implementation, the second sub-housing 150 includes a third protrusion part 154 protruding in a direction away from the third sub-housing 160. The third sub-housing 160 includes a fourth protrusion part 163 protruding in a direction away from the second sub-housing 150. The third protrusion part 154 and the fourth protrusion part 163 are disposed oppositely and connected to each other to jointly form the second flow channel 500.

Still referring to FIG. 26, in an implementation, an area size of an inner surface of the third sub-housing 160 is equal to an area size of an outer surface of the second sub-housing 150. The third sub-housing 160 forms an integrated structure by using the deep drawing process. The third sub-housing 160 includes a third bottom wall 161 and a third side wall 162. The third bottom wall 161 is located on one side of the second bottom wall 151 that is away from the first bottom wall 141. The third side wall 162 is located on one side of the second side wall 152 that is away from the first side wall 142. The second flow channel 500 is located between the third bottom wall 161 and the second bottom wall 151. In this implementation, the third bottom wall 161, the second bottom wall 151, and the first bottom wall 141 are stacked in the third direction Z to jointly form the bottom plate 110, and the second flow channel 500 is located in the bottom plate 110.

In an implementation, the second flow channel 500 is located between the third side wall 162 and the second side wall 152. The third side wall 162, the second side wall 152, and the first side wall 142 jointly form the peripheral side plate 120, and the second flow channel 500 is located in the peripheral side plate 120.

In an implementation, a part of the second flow channel 500 is located between the third bottom wall 161 and the second bottom wall 151, and a part of the second flow channel 500 may be located between the third side wall 162 and the second side wall 152. The second flow channel 500 is distributed in the bottom plate 110 and the peripheral side plate 120.

Still referring to FIG. 25, in a possible implementation, a projection of the second flow channel 500 on the second sub-housing 150 in a thickness direction of the second sub-housing 150 at least partially overlaps a projection of the first flow channel 300 on the second sub-housing 150 in the thickness direction of the second sub-housing 150. The thickness direction of the second sub-housing 150 is a direction perpendicular to a part that is of the second sub-housing 150 and in which the second flow channel 500 or the first flow channel 300 is located. For example, when the second flow channel 500 and the first flow channel 300 are located in the bottom plate 110 of the housing 100, the thickness direction is a direction perpendicular to the bottom plate 110, that is, a third direction Z in FIG. 25. When the second flow channel 500 and the first flow channel 300 are located in the second side plate 122 of the peripheral side plate 120 (as shown in FIG. 1), the thickness direction is a direction perpendicular to the second side plate 122.

Figure 27:
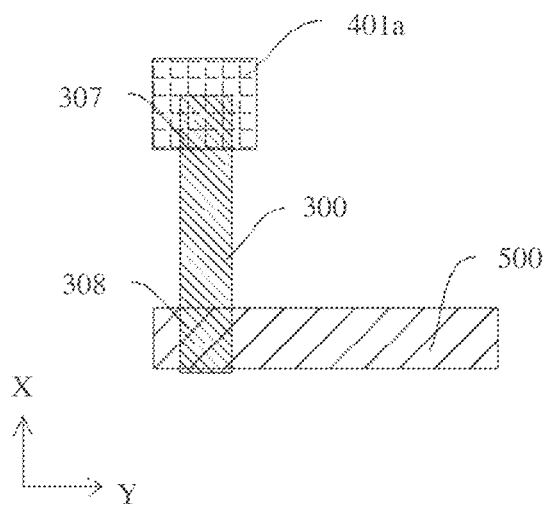
FIG. 27 is a schematic diagram of locations of a first flow channel, a second flow channel, and a heat generating component in a power supply enclosure according to an implementation of this application.

According to the foregoing design, heat transfer between the second flow channel 500 and the first flow channel 300 is continuous. The first flow channel 300 may extend to a location of a heat generating component 401 that needs heat dissipation, so that the second flow channel 500 and the first flow channel 30) are more flexibly designed, to adapt to a plurality of types of power supply conversion functional assemblies 400 disposed in different structures. As shown in FIG. 27, the power supply conversion functional assembly 400 includes a heat generating component 401a with a high heat generation capacity. A first end 307 of the first flow channel 300 may be stacked with the heat generating component 401a, and the other end 308 of the first flow channel 300 may be stacked with the second flow channel 500. A cooling medium with a low temperature or a phase change medium with a high heat absorption rate may be provided in the first flow channel 300. The first end 307 of the first flow channel 300 absorbs heat of the heat generating component 401a, and the heat is transferred to the second flow channel 500 through the other end 308 of the first flow channel 300 for heat dissipation. A pattern and a shape may be designed for the first flow channel 300 based on a location of the heat generating component 401.

Still referring to FIG. 25, in a possible implementation, the second flow channel 500 is not connected to the first flow channel 300, a first medium 301 is provided in the first flow channel 300, a second medium 501 is provided in the second flow channel 500, and a thermal conductivity of the second medium 501 is greater than a thermal conductivity of the first medium 301. That a thermal conductivity of the second medium 501 is greater than a thermal conductivity of the first medium 301 indicates that the second medium 501 has better heat dissipation efficiency, and can rapidly absorb heat of the heat generating components 401. In an implementation, the second medium 501 is a phase change material, and the first medium 301 is water.

In some implementations, the second flow channel 500 is connected to the first flow channel 300, and the two layers of flow channels can increase a flow path of a coolant in the housing 100, thereby improving a heat dissipation effect.

In some implementations, the housing 100 may further include more stacked sub-housings to form a plurality of flow channels, which may be specifically disposed based on a requirement, to improve a heat dissipation effect.

Figure 28:
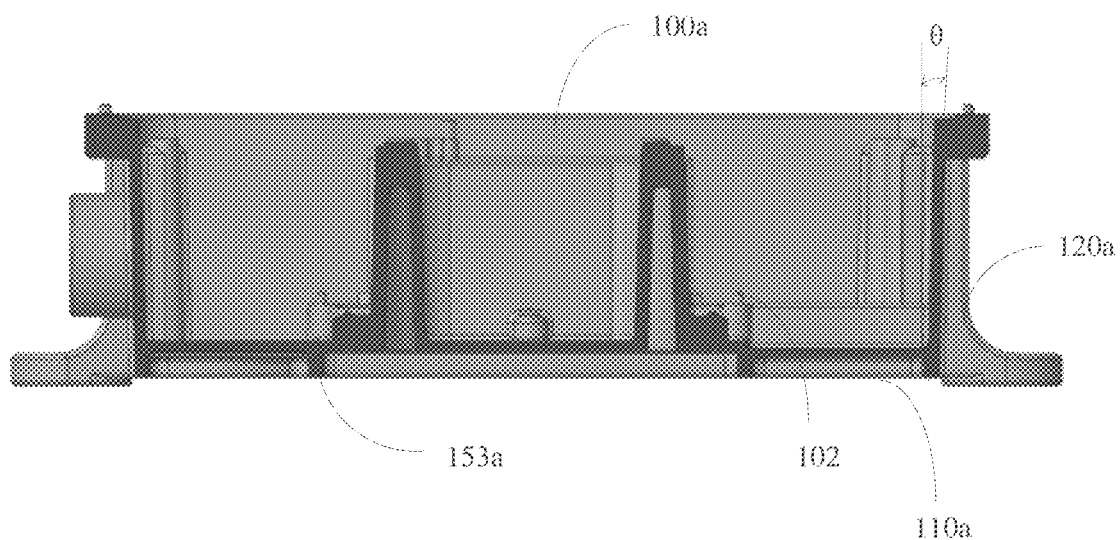
FIG. 28 is a schematic diagram of a structure of a housing formed by using a die casting process.

It should be noted that, the housing 10x) in this application is an integrated housing 100 formed by using the deep drawing process. Referring to FIG. 28, in a manner in which a housing 100a with an integrated structure formed by using the die casting process is fixedly connected to the power supply conversion functional assembly 400, a fixing post 102 is integrally formed in the housing 100a by die casting. Then, the power supply conversion functional assembly 400 is fixed by using the fixing post 102. However, a fixing post 102 cannot be formed inside the housing 100 with an integrated structure formed by using the deep drawing process, and a process of welding fixing posts 102 one by one to the housing 100 is complex and has a low welding yield. In this application, as described above, the housing 100 is fixedly connected to the power supply conversion functional assembly 400 by using the fixing plate 20X.

In this application, the housing 100 with an integrated structure formed by using the deep drawing process and the housing 100a with an integrated structure formed by using the die casting process have at least one of the following differences:

(1) The housing 100 formed by using the deep drawing process has a uniform thickness, a uniform color and gloss on a surface of its material, and no air hole defect inside the material, while the housing 100a formed by using the die casting process may have a non-uniform wall thickness for its material, a non-uniform color or gloss on a surface, a flow mark, and defects such as an air hole and shrinkage porosity inside the material.

(2) In the housing 100 formed by using the deep drawing process, a wall thickness of an inner layer (the first sub-housing 140) is usually 1.5 mm, and a wall thickness of an outer layer (the second sub-housing 150) is usually 1.0 mm. In contrast, the housing 100a formed by using the die casting process may have a non-uniform wall thickness. Due to a limitation of the die casting process, a wall thickness of a single layer is greater than 2 mm, and the wall thickness needs to increase with a size.

(3) In the housing 100 formed by using the deep drawing process, a junction between a side wall (the peripheral side plate 120) and a bottom wall (the bottom plate 110) is a fillet 103 (as shown in FIG. 4), and a radius of an outer fillet is greater than 5 mm. In contrast, in the housing 100a formed by using the die casting process, a junction between a side wall 120a and a bottom wall 110a is not a fillet (as shown in FIG. 28).

(4) In the housing 100 formed by using the deep drawing process, a side wall (the peripheral side plate 120) is perpendicular to a bottom wall (the bottom plate 110). In contrast, in the housing 100a formed by using the die casting process, the side wall 120a is usually disposed with a pattern draft to facilitate mold stripping, that is, the side wall 120a is disposed by deviating from a direction perpendicular to the bottom wall 110a, and the pattern draft θ is at least 1°.

(5) When the housing 100 formed by using the deep drawing process has a protrusion feature outside, there is definitely a recess feature inside. For example, for the second protrusion part 153 in FIG. 15, a protrusion outside the second sub-housing 150 and a recess inside the second sub-housing 150 appear simultaneously. However, a protrusion feature 153a outside the housing 100a formed by using the die casting process may exist alone (as shown in FIG. 28), and there may be no recess inside the housing 100a.

(6) Each protrusion feature (for example, the first flow channel 300) in the housing 100 formed by using the deep drawing process has a fillet. As shown in FIG. 15, there is the fillet 104 between the second protrusion part 153 and another part of the second sub-housing 150. A thickness of the fillet 104 is greater than or equal to one time the thickness of the second sub-housing 150. However, the protrusion feature 153a of the housing 100a formed by using the die casting process has no fillet limitation (as shown in FIG. 28), but has a pattern draft.

(7) Compared with the housing 100 formed by using the deep drawing process, the housing 100a formed by using the die casting process definitely has a parting line of a module, a slag hole, and a feed port on an outer wall, and there are definitely polish marks at these locations.

Still referring to FIG. 2a and FIG. 2b, an implementation of this application further provides a power supply conversion apparatus 20. The power supply conversion apparatus 20 includes a power supply conversion functional assembly 400 and the power supply enclosure 10 according to any one of the foregoing implementations. The power supply conversion functional assembly 400 is located in the accommodation cavity 101 in the housing 100, and is fixedly connected to the fixing plate 200. The power supply conversion apparatus 20 implements a power supply conversion function by using the power supply conversion functional assembly 400. Power supply conversion includes converting an alternating current into a high-voltage direct current, for example, converting a 220 V household alternating current or a 380 V commercial alternating current into a high-voltage direct current for charging a target device. When the target device is a vehicle, the high-voltage direct current may be 450 V. Alternatively, the target device may be another device that needs to be powered. The power supply conversion further includes converting a high-voltage direct current into a low-voltage direct current, for example, converting a high-voltage direct current in a vehicle into a low-voltage direct current that supplies power to low-voltage components such as a vehicle lamp, a stereo, and a radio.

The power supply conversion functional assembly 400 includes a circuit board 410, a magnetic component 420, and the like. Heat generating components 401 of the power supply conversion functional assembly 400 include an insulated gate bipolar transistor, a triode, a MOS transistor, and the like located on the circuit board 410. The heat generating components 401 further include an inductor component, a transformer, or the like in the magnetic component 420. One function of die circuit board 410 is to connect the insulated gate bipolar transistor, the triode, die MOS transistor, the magnetic component 420, and the like.

In a possible implementation, the power supply enclosure 10 further includes a cover plate 600. One side of the housing 100 has an opening 106, and the cover plate 600 covers the opening 106 of the housing 100.

Figure 29:
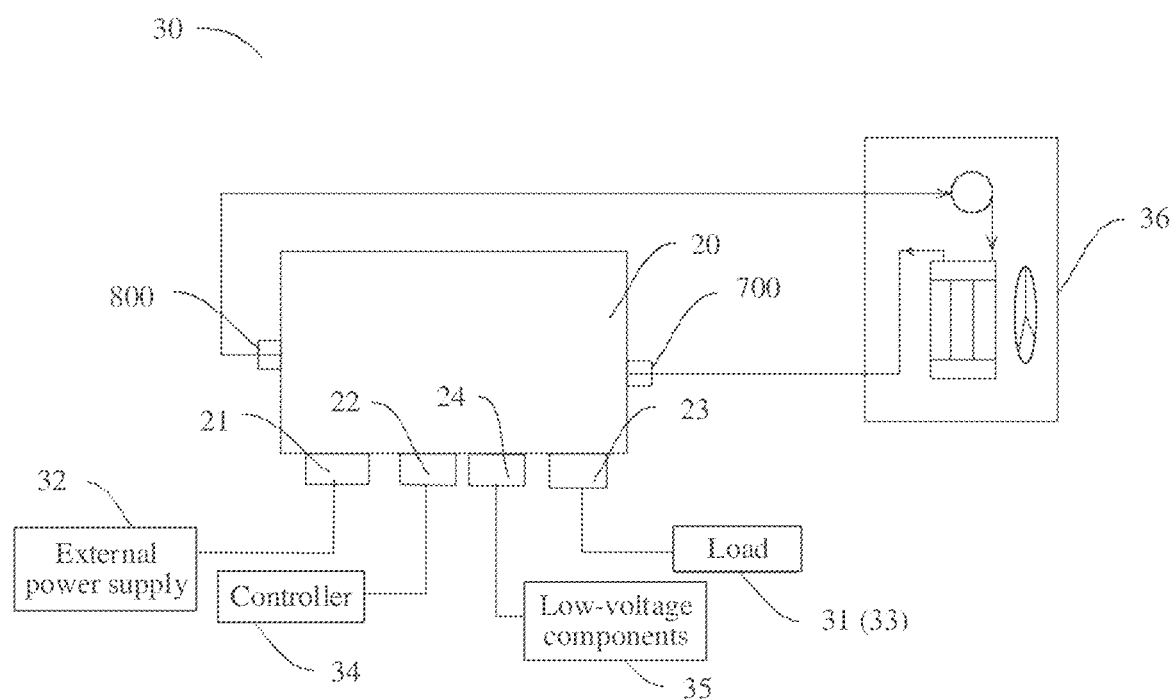
FIG. 29 is a schematic diagram of a structure of an electronic device according to an implementation of this application.

Referring to FIG. 29, an implementation of this application further provides an electronic device 30. The electronic device 30 includes a load 31 and the foregoing power supply conversion apparatus 20. The power supply conversion apparatus 20 is electrically connected to the load 31 and configured to supply power to the load 31. The power supply conversion apparatus 20 provides converted power to the load 31, to supply power to the load 31.

In a possible implementation, the electronic device 30 is a vehicle, a charging pile, a charging power station, a communication device, or a data center. The data center includes a cabinet or a data equipment room. Alternatively, the electronic device 30 may be another device that requires power supply conversion.

When the electronic device 30 is a vehicle, the power supply conversion apparatus 20 is a vehicle-mounted charger. The power supply conversion apparatus 20 is fixed inside the vehicle 30 by using a fixing bracket 26 (as shown in FIG. 2a). A first connection interface 21, a second connection interface 22, and a third connection interface 23 are further disposed on an outer side of the housing 100. Three connection holes 107, 107a, and 107b are disposed on the housing 100 (as shown in FIG. 3). The first connection interface 21, the second connection interface 22, and the third connection interface 23 respectively pass through the connection holes 107, 107a, and 107b, and are electrically connected to the power supply conversion functional assembly 40. The first connection interface 21, the second connection interface 22, and the third connection interface 23 may be fixed to the outer side of the housing 100 by screwing or riveting. The first connection interface 21 is configured to connect to an external power supply 32, for example, connect to a 220 V household alternating current voltage. The second connection interface 22 is configured to connect to an external controller 34. The controller 34 is configured to control the power supply conversion apparatus 20 to work. The third connection interface 23 is configured to connect to the load 31. In the vehicle, the third connection interface 23 is configured to connect to a battery pack 33. The battery pack 33 is a lithium-ion battery pack and is configured to supply power to the vehicle. When the vehicle needs to be charged, the first connection interface 21 is connected to the external power supply, the power supply conversion apparatus 20 converts the 220 V household alternating current voltage into a 450 V high-voltage direct current, and the third connection interface 23 is used to charge the battery pack 33. This implements power supply conversion from an alternating current to a high-voltage direct current.

A fourth connection interface 24 is further disposed on the outer side of the housing 100. The fourth connection interface 24 is configured to connect to low-voltage components 35 in the vehicle. The low-voltage components 35 include a vehicle lamp, a stereo, a radio, and the like. When the low-voltage components 35 in the vehicle need to be powered, the battery pack 33 is a powering apparatus. A high-voltage direct current of the battery pack 33 is input to the power supply conversion apparatus 20 through the third connection interface 23. The power supply conversion apparatus 20 converts the 450 V high-voltage direct current into a 12 V low-voltage direct current, and charges the low-voltage components through the fourth connection interface 24. This implements power supply conversion from a high-voltage direct current to a low-voltage direct current.

In this implementation, the electronic device 30 further includes an external cooling circulation system 36. The external cooling circulation system 36 is connected to the liquid inlet nozzle 700 and the liquid outlet nozzle 800 in the power supply enclosure 10. A cooling fluid that is in the first flow channel 300 in the housing 100 and that is obtained after heat absorption is returned from the liquid outlet nozzle 800 to the external cooling circulation system 36, and is cooled by the external cooling circulation system 36. The cooled cooling fluid is then input from the liquid inlet nozzle 700 to the first flow channel 300 to cool the power supply conversion functional assembly 400. The external cooling circulation system 36 is not limited to a structure shown in FIG. 29, and may have another structure.

In some implementations, when the electronic device 30 is a data center, the load 31 is a server in the data center. The power supply conversion apparatus 20 converts 380 V commercial power into a direct current that supplies power to the server. A voltage obtained after conversion by the power supply conversion apparatus 20 may be set based on the load 31.

The power supply enclosure, the power supply conversion apparatus, and the electronic device provided in the embodiments of this application are described in detail. Specific examples are used in this specification to describe the principles and the embodiments of this application. The foregoing embodiments are merely used to help understand the method and the core idea of this application. In addition, a person of ordinary skill in the art can change both a specific embodiment and an application scope according to the idea of this application. In conclusion, the content of the present specification shall not be construed as a limitation to this application

What is claimed is:
1. A power supply enclosure, comprising:
a housing, wherein the housing has an accommodation cavity, and wherein a first flow channel is disposed in the housing; and
a fixing plate located in the accommodation cavity, wherein at least a part of a surface of the fixing plate that faces the housing is fixedly connected to at least a part of an inner surface of the housing, and wherein the fixing plate is configured to fix a power supply conversion functional assembly, so as to perform heat dissipation on a heat generating component in the power supply conversion functional assembly by using a cooling fluid in the first flow channel, wherein the fixing plate is provided with a fixing hole, the fixing hole is internally provided with a fixing sub-member, and the fixing hole cooperates with the fixing sub-member to fix the power supply conversion functional assembly.

2. The power supply enclosure according to claim 1, wherein the housing comprises:

a bottom plate; and a peripheral side plate that is located on one side of the bottom plate and that surrounds the bottom plate, wherein the bottom plate and the peripheral side plate form the accommodation cavity through the enclosure, wherein the fixing plate comprises a first fixing sub-plate stacked with the bottom plate, wherein at least a part of a surface of the first fixing sub-plate that faces the bottom plate is fixedly connected to at least a part of an inner surface of the bottom plate, and wherein an area of the surface of the first fixing sub-plate that faces the bottom plate is greater than or equal to 0.5 times an area of the surface of the bottom plate that faces the first fixing sub-plate, and is less than or equal to the area of the surface of the bottom plate that faces the first fixing sub-plate.

3. The power supply enclosure according to claim 2, wherein the fixing plate further comprises a second fixing sub-plate, wherein the second fixing sub-plate is located on an inner side of the peripheral side plate, and intersects the first fixing sub-plate, and wherein at least a part of a surface of the second fixing sub-plate that faces the peripheral side plate is fixedly connected to at least a part of an inner surface of the peripheral side plate.

4. The power supply enclosure according to claim 2, wherein the peripheral side plate is perpendicular to the bottom plate.

5. The power supply enclosure according to claim 2, wherein a junction between the peripheral side plate and the bottom plate is a fillet.

6. The power supply enclosure according to claim 1, wherein parts of the housing except the first flow channel are an integrated structure.

7. The power supply enclosure according to claim 1, wherein the housing comprises a first sub-housing and a second sub-housing, wherein the first sub-housing is nested in the second sub-housing, wherein a cavity of the first sub-housing is the accommodation cavity, wherein the first sub-housing is fixedly connected to the fixing plate, wherein the first flow channel is located between the first sub-housing and the second sub-housing, and wherein an edge of an opening of the first sub-housing is sealed with an edge of an opening of the second sub-housing.

8. The power supply enclosure according to claim 7, wherein one of:

the first sub-housing comprises a first protrusion part protruding in a direction away from the second sub-housing, and the second sub-housing and the first protrusion part form the first flow channel;

the second sub-housing comprises a second protrusion part protruding in a direction away from the first sub-housing, and the first sub-housing and the second protrusion part form the first flow channel; or the first sub-housing comprises a first protrusion part protruding in a direction away from the second sub-housing, the second sub-housing comprises a second protrusion part protruding in a direction away from the first sub-housing, and the first protrusion part and the second protrusion part are disposed oppositely and connected to each other to jointly form the first flow channel.

9. The power supply enclosure according to claim 8, wherein a junction between the first protrusion part and a part of the first sub-housing, except the first protrusion part, is a fillet.

10. The power supply enclosure according to claim 7, wherein the power supply enclosure further comprises a third sub-housing, the first sub-housing and the second sub-housing are nested in the third sub-housing, and a second flow channel is disposed between the third sub-housing and the second sub-housing.

11. The power supply enclosure according to claim 10, wherein a projection of the second flow channel on the second sub-housing in a thickness direction of the second sub-housing at least partially overlaps a projection of the first flow channel on the second sub-housing in the thickness direction of the second sub-housing.

12. The power supply enclosure according to claim 10, wherein the second flow channel is not connected to the first flow channel, a first medium is provided in the first flow channel, a second medium is provided in the second flow channel, and a thermal conductivity of the second medium is greater than a thermal conductivity of the first medium.

13. The power supply enclosure according to claim 7, wherein the fixing plate is provided with an avoidance hole running through two opposite surfaces of the fixing plate, a projection of the avoidance hole on the first sub-housing in a thickness direction of the first sub-housing at least partially overlaps a projection of the first flow channel on the first sub-housing in the thickness direction of the first sub-housing, and the avoidance hole is configured to accommodate at least one of heat generating components.

14. The power supply enclosure according to claim 13, wherein the first sub-housing comprises a first protrusion part protruding in a direction away from the second sub-housing, the second sub-housing and the first protrusion part form the first flow channel, the first protrusion part is located in the avoidance hole, and the first protrusion part abuts against at least a part of an inner surface that is of the power supply conversion functional assembly and that faces the first sub-housing.

15. A power supply conversion apparatus comprising:

a power supply conversion functional assembly located in an accommodation cavity in a housing, fixedly connected to a fixing plate; and a power supply enclosure;

wherein the power supply enclosure comprises the housing and the fixing plate, the housing has the accommodation cavity, and a first flow channel is disposed in the housing, wherein the fixing plate is located in the accommodation cavity;

wherein at least a part of a surface of the fixing plate that faces the housing is fixedly connected to at least a part of an inner surface of the housing;

wherein the fixing plate is configured to fix the power supply conversion functional assembly to perform heat dissipation on a heat generating component in the power supply conversion functional assembly by using a cooling fluid in the first flow channel; and wherein the fixing plate is provided with a fixing hole, the fixing hole is internally provided with a fixing sub-member, and the fixing hole cooperates with the fixing sub-member to fix the power supply conversion functional assembly.

16. An electronic device comprising:
a load; and
a power supply conversion apparatus, wherein the power supply conversion apparatus is electrically connected to the load and configured to supply power to the load, and wherein the power supply conversion apparatus comprises:
a power supply enclosure; and
a power supply conversion functional assembly located in an accommodation cavity in a housing, wherein the power supply conversion functional assembly is fixedly connected to a fixing plate;
wherein the power supply enclosure comprises the housing and h fixing plate, wherein the housing has h accommodation cavity and a first flow channel disposed in the housing, wherein the fixing plate is located in the accommodation cavity, wherein at least a part of a surface of the fixing plate that faces the housing is fixedly connected to at least a part of an inner surface of the housing, and wherein the fixing plate is configured to fix to the power supply conversion functional assembly to perform heat dissipation on a heat generating component in the power supply conversion functional assembly by using a cooling fluid in the first flow channel; and
wherein the fixing plate is provided with a fixing hole, the fixing hole is internally provided with a fixing sub-member, and the fixing hole cooperates with the fixing sub-member to fix the power supply conversion functional assembly.

\* \* \* \* \*

UNITED STATES PATENT AND TRADEMARK OFFICE
CERTIFICATE OF CORRECTION

| | | |
|---|---|---|
| PATENT NO. | : 12,308,734 B2 | Page 1 of 1 |
| APPLICATION NO. | : 17/966333 | |
| DATED | : May 20, 2025 | |
| INVENTOR(S) | : Du et al. | |

It is certified that error appears in the above-identified patent and that said Letters Patent is hereby corrected as shown below:

In the Claims

In Column 31, in Claim 16, Line 19, delete "and h" and insert -- and the --.

In Column 31, in Claim 16, Line 19, delete "has h" and insert -- has the --.

Signed and Sealed this
Eighth Day of July, 2025

Coke Morgan Stewart
*Acting Director of the United States Patent and Trademark Office*